(12) United States Patent
Choi et al.

(10) Patent No.: US 11,604,529 B2
(45) Date of Patent: *Mar. 14, 2023

(54) DISPLAY DEVICE

(71) Applicant: SAMSUNG DISPLAY CO., LTD., Yongin-si (KR)

(72) Inventors: Jaeuk Choi, Seoul (KR); Yun-Ho Kim, Hwaseong-si (KR); Chul Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/697,552

(22) Filed: Mar. 17, 2022

(65) Prior Publication Data

US 2022/0206624 A1 Jun. 30, 2022

Related U.S. Application Data

(63) Continuation of application No. 17/229,613, filed on Apr. 13, 2021, now Pat. No. 11,281,321.

(30) Foreign Application Priority Data

Aug. 14, 2020 (KR) .................. 10-2020-0102238

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0446* (2019.05); *H01L 27/323* (2013.01); *G06F 2203/04111* (2013.01)

(58) Field of Classification Search
CPC ............ H01L 27/32–3293; G06F 3/041–047; G06F 2203/041–04114
See application file for complete search history.

(56) References Cited

U.S. PATENT DOCUMENTS

| 8,410,795 B1 | 4/2013 | Peng et al. |
| 8,711,105 B2 | 4/2014 | Gray et al. |
| 9,018,536 B2 | 4/2015 | Ullmann et al. |
| 9,075,484 B2 | 7/2015 | Ritter et al. |

(Continued)

FOREIGN PATENT DOCUMENTS

| KR | 10-2016-0043585 A | 4/2016 |
| KR | 10-1905741 B1 | 12/2018 |

*Primary Examiner* — Sanjiv D. Patel
(74) *Attorney, Agent, or Firm* — Lewis Roca Rothgerber Christie LLP

(57) ABSTRACT

A display device includes a display panel and an input sensor. The input sensor includes a first electrode and a second electrode crossing each other and a bridge pattern at a crossing area of the first electrode and the second electrode. One of the first electrode and the second electrode includes a plurality of center patterns each having a first opening, a plurality of first patterns at one side of the plurality of center patterns and each having a second opening, a plurality of second patterns at another side of the plurality of center patterns and each having a third opening, and a plurality of third patterns for electrically connecting two adjacent patterns from among the plurality of center patterns, the plurality of first patterns, and the plurality of second patterns.

22 Claims, 22 Drawing Sheets

(56) References Cited

U.S. PATENT DOCUMENTS

| | | |
|---|---|---|
| 9,753,595 B2 | 9/2017 | Kim et al. |
| 2013/0278513 A1* | 10/2013 | Jang ...................... G06F 3/0445 |
| | | 345/173 |
| 2015/0138453 A1* | 5/2015 | Jang .................... G06F 3/04164 |
| | | 349/12 |
| 2018/0232070 A1 | 8/2018 | Katsurahira |
| 2018/0275801 A1 | 9/2018 | Nakayama et al. |
| 2019/0004637 A1 | 1/2019 | Bani et al. |

* cited by examiner

< Mode 1 >

< Mode 2 >

< Mode 2 >

DISPLAY DEVICE

CROSS-REFERENCE TO RELATED APPLICATIONS

This application is a continuation of U.S. patent application Ser. No. 17/229,613, filed Apr. 13, 2021, which claims priority to and the benefit of Korean Patent Application No. 10-2020-0102238, filed on Aug. 14, 2020 in the Korean Intellectual Property Office (KIPO), the entire content of both of which is incorporated by reference herein.

BACKGROUND

1. Field

The present disclosure generally relates to a display device, and more particularly, to a display device with improved sensing performance.

2. Description of the Related Art

Multimedia electronic devices such as a television, a mobile phone, a tablet computer, a navigation device, and a game machine each have a display device for displaying an image. Electronic devices may each include an input sensor capable of providing a touch-based input method that enables a user to easily input information or commands in an intuitive and convenient manner, in addition to typical input methods using, for example, a button, a keyboard, or a mouse.

The input sensor may sense a touch or pressure provided by a body part of a user. Meanwhile, there is an increasing demand for sensing input from an active pen to provide detailed touch input information under the guidance of a user who is familiar with information input using a writing instrument or to provide detailed touch input information for a specific application program (e.g., an application program for sketching or drawing).

SUMMARY

Aspects of one or more embodiments of the present disclosure are directed towards a display device with improved sensing performance for both an input of a passive type and an input of an active type.

An embodiment of the present inventive concept provides a display device including a display panel and an input sensor. The input sensor is on the display panel and includes a first electrode extending in a first direction, a second electrode extending in a second direction crossing the first direction, and a bridge pattern at a crossing area of the first electrode and the second electrode. One of the first electrode and the second electrode includes a plurality of center patterns, a plurality of first patterns, a plurality of second patterns, and a plurality of third patterns. The plurality of center patterns are arranged along the second direction and each have a first opening. The plurality of first patterns are at one side of the plurality of center patterns in the first direction, arranged along the second direction, and each have a second opening. The plurality of second patterns are at another side of the plurality of center patterns in the first direction, arranged along the second direction, and each have a third opening. The plurality of third patterns are configured to electrically connect two adjacent patterns from among the plurality of center patterns, the plurality of first patterns, and the plurality of second patterns. The other one of the first electrode and the second electrode includes a plurality of line elements between two adjacent patterns from among the plurality of center patterns, the plurality of first patterns, and the plurality of second patterns.

In an embodiment, a width of the first electrode in the second direction may be substantially uniform, and a width of the second electrode in the first direction may be substantially uniform.

In an embodiment, the plurality of center patterns may include center patterns of a first group having the same shape and a center pattern of a second group having a shape different from the shape of each of the center patterns of the first group.

In an embodiment, the center patterns of the first group may each have a rhombus shape.

In an embodiment, the plurality of first patterns may include first patterns of a first group having the same shape and a first pattern of a second group having a shape different from the shape of each of the first patterns of the first group.

In an embodiment, the first patterns of the first group may each have a rectangular shape.

In an embodiment, the plurality of second patterns may include second patterns of a first group having the same shape and a second pattern of a second group having a shape different from the shape of the second patterns of the first group. Each of the first patterns of the first group may extend in a direction crossing the first direction and the second direction, and the first patterns of the first group and the second patterns of the first group may respectively extend in directions that cross each other.

In an embodiment, the plurality of first patterns and the plurality of second patterns may be symmetrical with respect to the plurality of center patterns.

In an embodiment, the plurality of first patterns may form a plurality of first pattern rows arranged along the first direction. The plurality of second patterns may form a plurality of second pattern rows arranged along the first direction.

In an embodiment, the bridge pattern may include a first bridge pattern. The second electrode may include a first part and a second part spaced from each other. The first bridge pattern may electrically connect the first part and the second part. The plurality of center patterns, the plurality of first patterns, the plurality of second patterns, and the plurality of third patterns may form the first part and the second part.

In an embodiment, the first bridge pattern may be in a current path of the second electrode.

In an embodiment, the bridge pattern may include a second bridge pattern. The first electrode may include a first part and a second part spaced from each other. The second bridge pattern may electrically connect the first part and the second part.

In an embodiment, the input sensor may further include an insulating layer. The bridge pattern may be below the insulating layer. The first electrode and the second electrode may be above the insulating layer.

In an embodiment, the plurality of line elements may include first line elements extending in a first crossing direction and second line elements extending in a second crossing direction. A first open area through which a corresponding third pattern of the third patterns passes may be defined in a first line element of the first line elements. A second open area through which a corresponding third pattern of the third patterns passes may be defined in a second line element of the second line elements.

In an embodiment, the plurality of line elements may include first line elements extending in a first crossing direction and second line elements extending in a second crossing direction. A part of the first line elements and a part of the second line elements may have an integral shape in the crossing area of the first electrode and the second electrode.

In an embodiment, the display panel may include a plurality of light emitting areas and a non-light emitting area adjacent to the plurality of light emitting areas. The plurality of center patterns, the plurality of first patterns, the plurality of second patterns, and the plurality of line elements may overlap the non-light emitting area.

In an embodiment, the plurality of light emitting areas may form a plurality of unit light emitting areas, and each of the plurality of unit light emitting areas may include a first light emitting area to generate light of a first color, a second light emitting area to generate light of a second color, and a third light emitting area to generate light of a third color, and a fourth light emitting area to generate light of the third color. A corresponding unit light emitting area from among the plurality of unit light emitting areas may be inside the first opening.

In an embodiment, an area of each of the second opening and the third opening may be larger than an area of the first opening.

In an embodiment, the display device may further include an input device configured to provide a driving signal to the input sensor. The input sensor may sense a user input through a change in capacitance between the first electrode and the second electrode in a first mode and may sense an input of the input device on a basis of the driving signal in a second mode.

In an embodiment of the present inventive concept, a display device includes: a display panel configured to display an image; and an input sensor on the display panel and includes a sensing area having a plurality of unit sensing areas arranged along a first direction and a second direction crossing each other in a matrix form, the input sensor includes a plurality of center patterns, a plurality of first patterns, a plurality of second patterns, a plurality of third patterns, a plurality of line elements, and a bridge pattern. The plurality of center patterns are arranged along the second direction and each have a first opening. The plurality of first patterns are at one side of the plurality of center patterns in the first direction, arranged along the second direction, and each have a second opening. The plurality of second patterns are at another side of the plurality of center patterns in the first direction, arranged along the second direction, and each have a third opening. The third patterns are configured to electrically connect two adjacent patterns from among the plurality of center patterns, the plurality of first patterns, and the plurality of second patterns. The plurality of line elements are between two adjacent patterns from among the plurality of center patterns, the plurality of first patterns, and the plurality of second patterns. The bridge pattern is configured to connect at least one of a first open area defined in a line element from among the plurality of line elements or a second open area defined in a third pattern from among the third patterns.

In an embodiment, the display device may further include a plurality of fourth patterns at a boundary of two adjacent unit sensing areas in the first direction from among the plurality of unit sensing areas and each have a fourth opening.

In an embodiment, each of the plurality of fourth patterns may be symmetrical with respect to the second direction.

In an embodiment, the plurality of center patterns, the plurality of first patterns, the plurality of second patterns, and the third patterns may be electrically connected to form a current path in one of the first direction and the second direction, the plurality of line elements may be electrically connected to form a current path in the other one of the first direction and the second direction, and the plurality of line elements may be electrically insulated from the plurality of center patterns.

In an embodiment of the present inventive concept, a display device includes: a display panel configured to display an image; and an input sensor on the display panel, the input sensor including a sensing area having a plurality of unit sensing areas arranged along a first direction and a second direction crossing each other in a matrix form. In each of the plurality of unit sensing areas, the input sensor includes a plurality of center patterns, a plurality of first patterns, a plurality of second patterns, a plurality of third patterns, a plurality of line elements, and a bridge pattern. The plurality of center patterns are arranged along the second direction and each have a first opening. The plurality of first patterns are at one side of the plurality of center patterns in the first direction, arranged along the second direction, and each have a second opening. The plurality of second patterns are at another side of the plurality of center patterns in the first direction, arranged along the second direction, and each have a third opening. The plurality of third patterns are configured to electrically connect two adjacent patterns from among the plurality of center patterns, the plurality of first patterns, and the plurality of second patterns. The plurality of line elements are between two adjacent patterns from among the plurality of center patterns, the plurality of first patterns, and the plurality of second patterns. The bridge pattern is configured to connect two adjacent first patterns from among the plurality of first patterns or two adjacent second patterns among the plurality of second patterns.

BRIEF DESCRIPTION OF THE FIGURES

The accompanying drawings are included to provide a further understanding of the present inventive concept, and are incorporated in and constitute a part of this specification. The drawings illustrate embodiments of the present inventive concept and, together with the description, serve to describe principles of the present inventive concept. In the drawings.

DETAILED DESCRIPTION

Figure 1A:
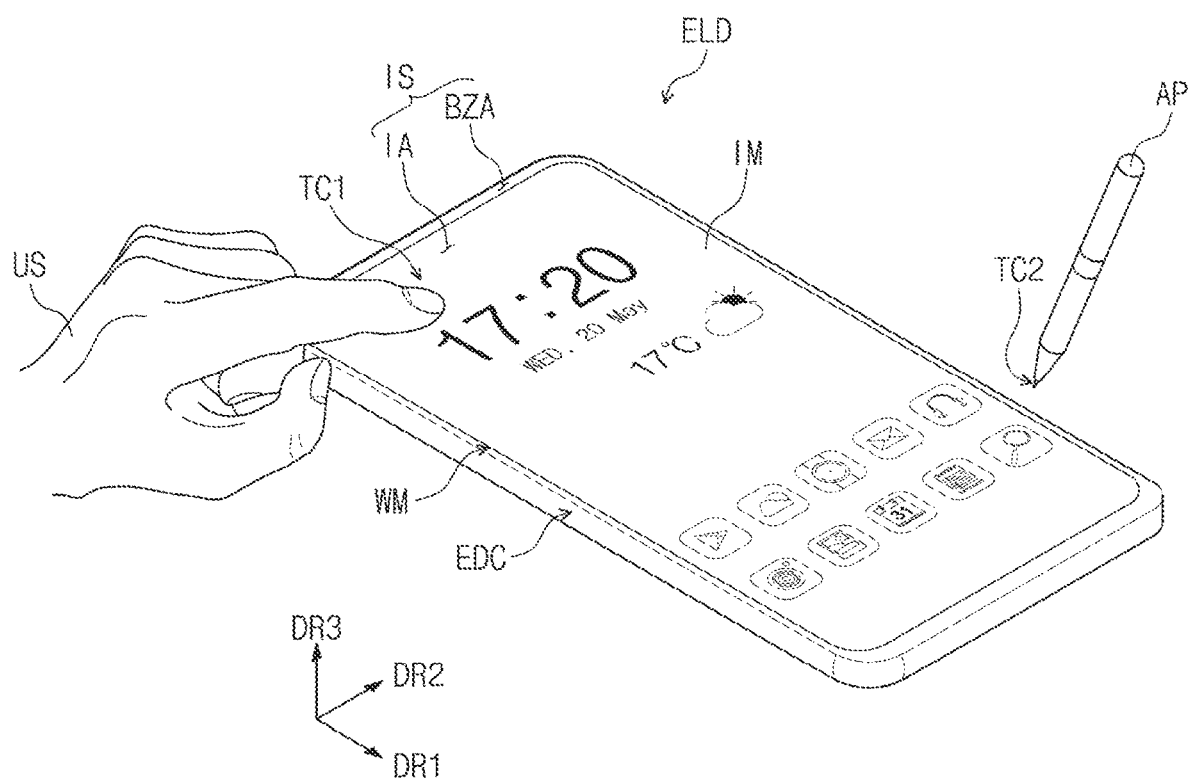
FIG. 1A is a perspective view of an electronic device according to an embodiment of the present inventive concept.

The present disclosure will now be described more fully with reference to the accompanying drawings in which example embodiments of the disclosure are shown. Like reference numerals in the drawings denote like elements throughout, and duplicative descriptions thereof may not be provided.

The terminology used herein is for the purpose of describing particular example embodiments only and is not intended to limit the example embodiments described herein.

It will be understood that when an element or layer (or region, portion, and the like) is referred to as being "on", "connected to" or "coupled to" another element or layer, it can be directly on, connected or coupled to the other element or layer, or intervening elements or layers may be present.

Like reference numerals refer to like elements throughout this specification. In the figures, the thicknesses, ratios and dimensions of elements are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "include," "comprise," and/or "have", when used in this specification, specify the presence of stated features, integers, steps, operations, elements, components, and/or groups thereof, but do not preclude the presence or addition of one or more other features, integers, steps, operations, elements, components, and/or groups thereof.

Further, the use of "may" when describing embodiments of the present disclosure refers to "one or more embodiments of the present disclosure".

As used herein, expressions such as "at least one of" and "one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be explained in detail with reference to the accompanying drawings.

Figure 1B:
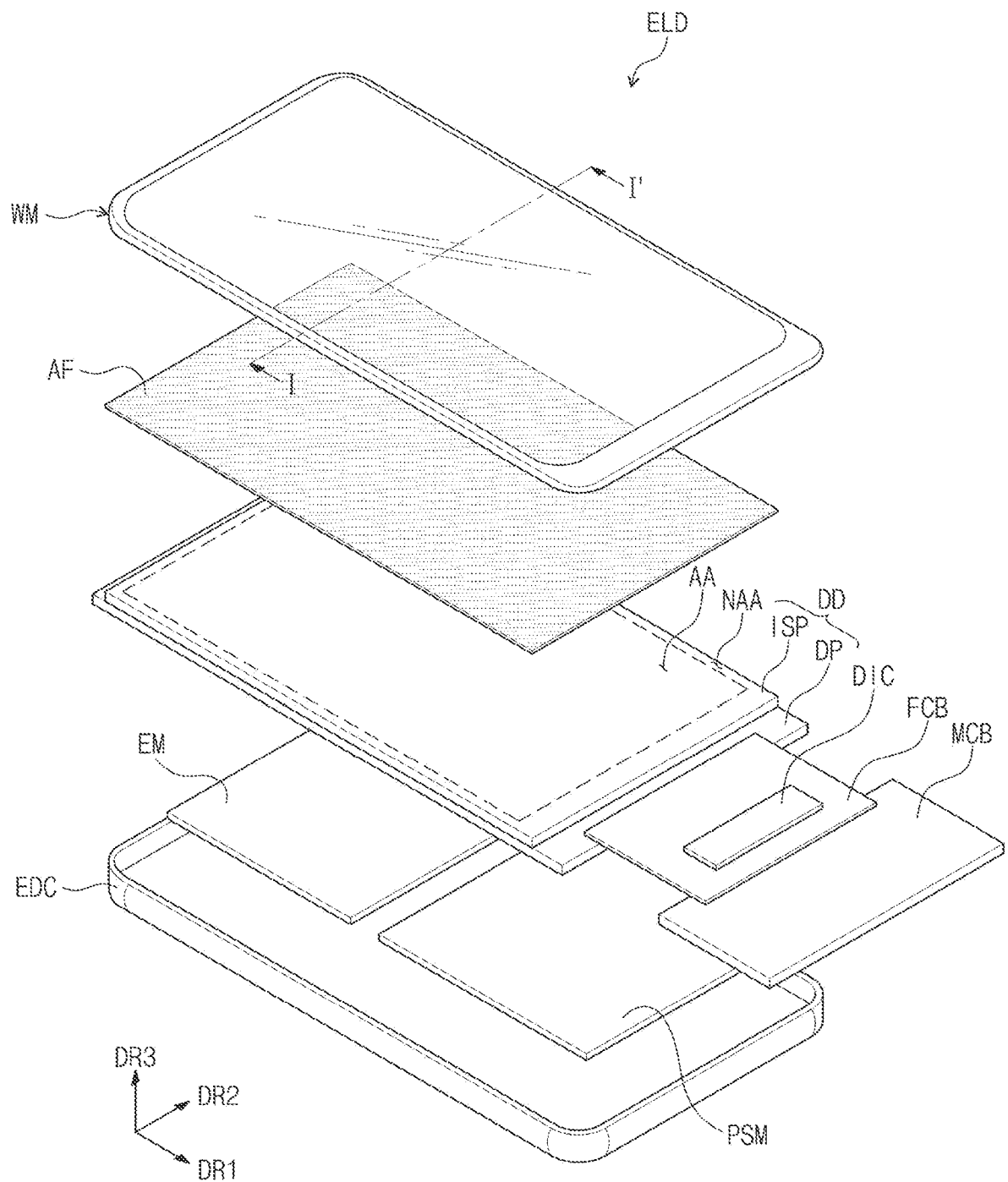
FIG. 1B is an exploded perspective view of an electronic device according to an embodiment of the present inventive concept.
Figure 2A:
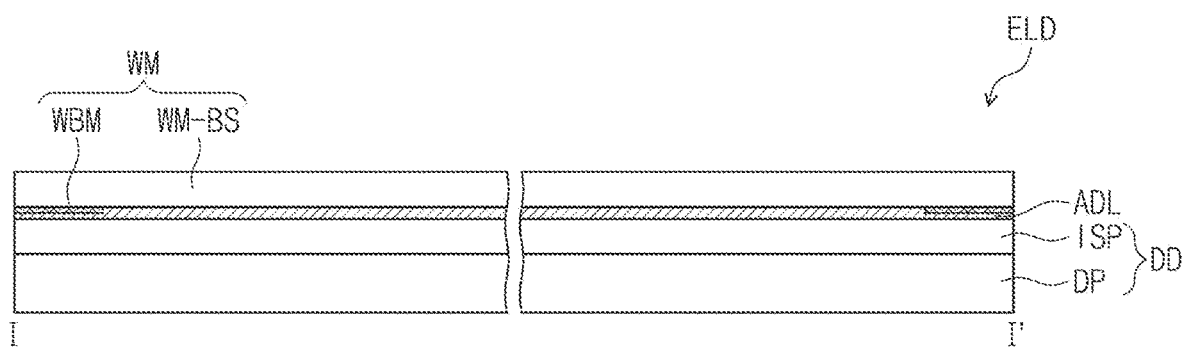
FIG. 2A and FIG. 2B are each a cross-sectional view of an electronic device taken along the line I-I' illustrated in FIG. 1B according to embodiments of the present inventive concept.
Figure 2B:
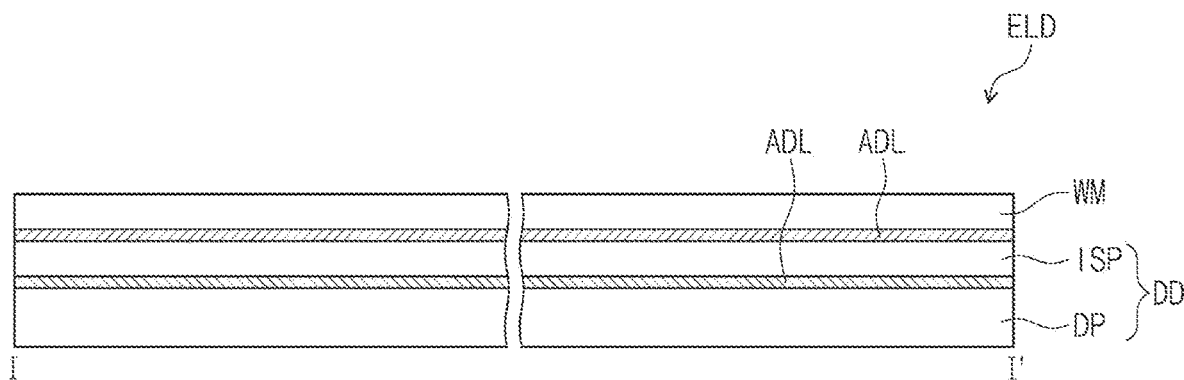
Figure 2C:
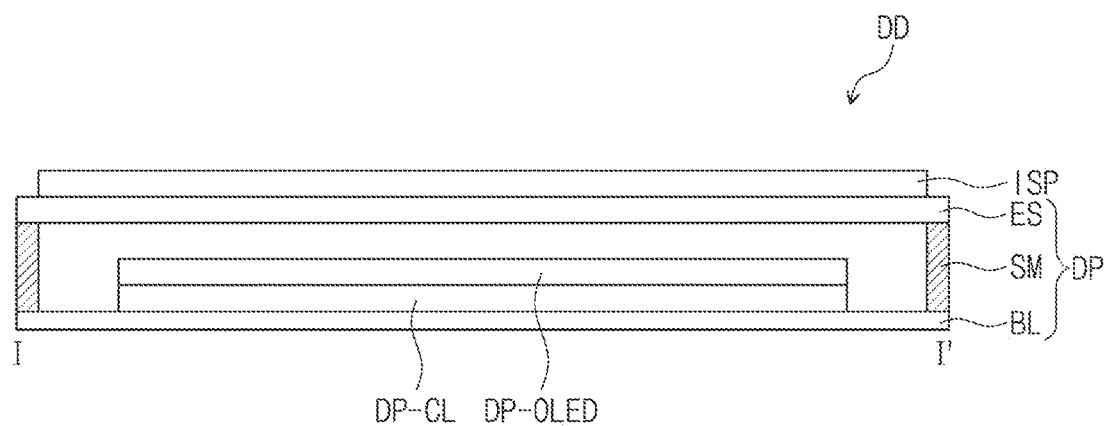
FIG. 2C and FIG. 2D are each a cross-sectional view of a display device taken along the line I-I' illustrated in FIG. 1B according to an embodiment of the present inventive concept.
Figure 2D:
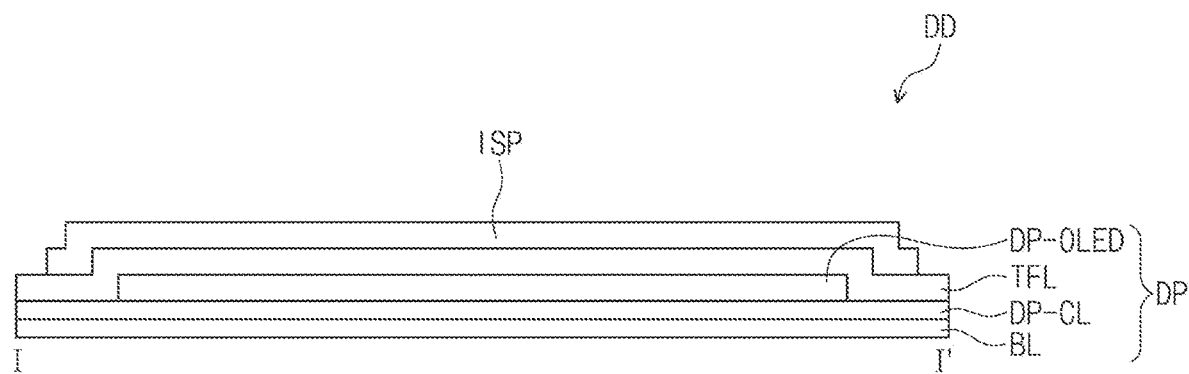

FIG. 1A is a perspective view of an electronic device ELD according to an embodiment of the present inventive concept, and FIG. 1B is an exploded perspective view of the electronic device ELD according to an embodiment of the present inventive concept. FIG. 2A and FIG. 2B are each a cross-sectional view of the electronic device ELD taken along the line I-I' illustrated in FIG. 1B according to embodiments of the present inventive concept. FIG. 2C and FIG. 2D are each a cross-sectional view of a display device DD taken along the line I-I' illustrated in FIG. 1B according to embodiments of the present inventive concept.

Referring to FIGS. 1A and 1B, the electronic device ELD may be a device that is activated according to an electrical signal. The electronic device ELD may include various embodiments. For example, the electronic device ELD may be applied to a smartphone, a tablet computer, a laptop computer, a personal computer, a smart television, and/or the like.

The electronic device ELD may display an image IM towards or in a third direction DR3 on (e.g., onto) a display surface IS. The display surface IS may be parallel to each of a first direction DR1 and a second direction DR2. In one or more embodiments, the display surface IS on which the image IM is displayed may correspond to a front surface of the electronic device ELD. The image IM may include a still image and/or a moving image.

In the illustrated embodiment, a front surface (or a top surface) and a rear surface (or a bottom surface) of each of members are defined in relation to a direction in which the image IM is displayed. The front surface and the rear surface may be opposite to each other in the third direction DR3, and a direction normal to each of the front surface and the rear surface may be parallel to the third direction DR3.

A separation distance between the front and rear surfaces in the third direction DR3 may correspond to a thickness in the third direction DR3 of the electronic device ELD. As used herein, directions indicated by the first to third directions DR1 to DR3 (i.e., the first direction DR1, the second direction DR2, and the third direction DR3) may also be defined differently from the directions defined in FIG. 1A.

The electronic device ELD may sense an external input applied from the outside. The external input may include various inputs provided from outside of the electronic device ELD. The electronic device ELD according to the illustrated embodiment may sense a first input TC1 applied from the outside. The first input TC1 may be an input by an input device (e.g., a passive stylus and/or the like) of a passive type, may be an input by the body of a user US, and may include all inputs that may change capacitance. The electronic device ELD may also sense, according to the structure of the electronic device ELD, the first input TC1 of the user US applied to any suitable surface such as a side surface or a rear surface of the electronic device ELD. Accordingly, the present inventive concept is not limited to any one embodiment.

Also, the electronic device ELD according to the illustrated embodiment may sense a second input TC2 of a type different from that of the first input TC1. The second input TC2 may be an input by an input device AP (e.g., an active pen and/or the like) of an active type. The input device AP may provide a driving signal to an input sensor ISP.

The front surface of the electronic device ELD may include an image area IA and a bezel area BZA. The image area IA may be an area in which the image IM is displayed. A user views the image IM through the image area IA. In the illustrated embodiment, the image area IA is illustrated as a quadrangular shape having round vertices. However, this is illustrated by way of example, and the image area IA may have various suitable shapes in other embodiments, and therefore, is not limited to any one embodiment.

The bezel area BZA is adjacent to the image area IA. The bezel area BZA may have a set color (e.g., a predetermined color). The bezel area BZA may surround the image area IA. Accordingly, the shape of the image area IA may be substantially defined by the bezel area BZA. However, this is illustrated as an example, and the bezel area BZA, in other embodiments, may be disposed adjacent to only one side of the image area IA or may be omitted. Therefore, the electronic device ELD according to the present inventive concept is not limited to any one embodiment.

As illustrated in FIG. 1B, the electronic device ELD may include the display device DD, an optical member AF, a window WM, an electronic module EM, a power supply module PSM, and a case EDC. The display device DD generates an image and senses an external input. The display device DD may include a display panel DP and the input sensor ISP. The display device DD includes an active area AA and a peripheral area NAA respectively corresponding to the image area IA (e.g., see FIG. 1A) and the bezel area BZA (e.g., see FIG. 1A) of the electronic device ELD.

The display panel DP may be, but is not particularly limited to, a light emitting display panel such as an organic light emitting display panel and a quantum dot light emitting display panel. A description of the input sensor ISP in more detail will be provided below.

The display device DD may further include a main circuit board MCB, a flexible circuit film FCB, and a driving chip DIC. Any one or more thereof may be omitted. The main circuit board MCB may be connected to the flexible circuit film FCB to be connected (e.g., electrically connected) to the display panel DP. The main circuit board MCB may include a plurality of driving elements. The plurality of driving elements may include an integrated chip for driving the display panel DP. The main circuit board MCB may be connected (e.g., electrically connected) to the electronic module EM through a connector.

The flexible circuit film FCB is connected to the display panel DP to connect (e.g., electrically connect) the display panel DP and the main circuit board MCB. The flexible circuit film FCB may be bent so that the main circuit board MCB faces a rear surface of the display device DD. The driving chip DIC may be mounted on the flexible circuit film FCB. The driving chip DIC may include driving elements for driving pixels of the display panel DP, for example, a data driving circuit. FIG. 1B illustrates a structure in which the driving chip DIC is mounted on the flexible circuit film FCB, but the present inventive concept is not limited thereto. For example, the driving chip DIC may be directly mounted on the display panel DP. A portion of the display panel DP may be bent, and the portion, when the driving chip DIC is mounted thereon, may be disposed to face the rear surface of the display device DD.

In one or more embodiments, an additional flexible circuit film may connect (e.g., electrically connect) the input sensor ISP to the main circuit board MCB. However, the present inventive concept is not limited thereto. The input sensor ISP may be connected (e.g., electrically connected) to the display panel DP and may be connected (e.g., electrically connected) to the main circuit board MCB through the flexible circuit film FCB.

The optical member AF lowers the degree of reflection of external light. The optical member AF may include a polarizer and a retarder. The polarizer and the retarder may be of a stretch type or a coated type. In an optical film of the coated type, an optical axis is defined according to a stretching direction of a functional film. The optical film of the coated type may include liquid crystal molecules arranged on a base film.

The optical member AF may be omitted in an embodiment of the present inventive concept. In this case, the display device DD may further include a color filter and a black matrix replacing the optical member AF. The window WM provides an outer surface of the electronic device ELD. The window WM includes a base substrate and may further include functional layers such as an anti-reflection layer and an anti-fingerprint layer.

In one or more embodiments, at least one adhesive layer may be further included in the display device DD. The adhesive layer may bond adjacent components of the display device DD. The adhesive layer may be an optically clear adhesive layer or a pressure sensitive adhesive layer.

The electronic module EM includes at least a main controller. The electronic module EM may include a wireless communication module, an image input module, a sound input module, a sound output module, a memory, an external interface module, and/or the like. The modules above may be mounted on the circuit board or may be connected (e.g., electrically connected) through a flexible circuit board. The electronic module EM is connected (e.g., electrically connected) to the power supply module PSM.

The main controller controls an overall operation of the electronic device ELD. For example, the main controller activates or deactivates the display device DD in accordance with a user input. The main controller may control operations of the display device DD, the wireless communication module, the image input module, the sound input module, the sound output module, and the like. The main controller may include at least one microprocessor.

The case EDC may be combined with the window WM. The case EDC protects the components accommodated in the case EDC by absorbing an impact applied from the outside and preventing or substantially preventing foreign matter/moisture or the like from permeating the display device DD. Meanwhile, in an embodiment of the present inventive concept, the case EDC may be provided in a form in which a plurality of storage members are combined.

Referring to FIG. 2A, the input sensor ISP may be disposed (e.g., directly disposed) on the display panel DP. According to an embodiment of the present inventive concept, the input sensor ISP may be formed on the display panel DP by a continuous process or a substantially continuous process. That is, when the input sensor ISP is disposed (e.g., directly disposed) on the display panel DP, an adhesive layer is not disposed between the input sensor ISP and the display panel DP. However, as illustrated in FIG. 2B, an adhesive layer ADL may be disposed between an input sensor ISP and a display panel DP. In this case, the input sensor ISP is not manufactured together with the display panel DP by a continuous process or a substantially continuous process, and the input sensor ISP is manufactured through a process separate from that of the display panel DP and then may be fixed to a top surface of the display panel DP by the adhesive layer ADL. In embodiments of FIG. 2A and FIG. 2B, the optical member AF illustrated in FIG. 1B may be present but is not illustrated. Alternatively, in other embodiments, a color filter and a black matrix may replace the optical member AF. Also, the components disposed below the display device DD (e.g., see FIG. 1B) may be present but are not illustrated in FIG. 2A and FIG. 2B.

As illustrated in FIG. 2A, the window WM may include a light blocking pattern WBM for defining the bezel area BZA (e.g., see FIG. 1A). The light blocking pattern WBM is a colored organic film and may be formed on one surface of a base layer WM-BS using, for example, a coating method.

As illustrated in FIG. 2C, the display panel DP includes a base layer BL, a circuit element layer DP-CL, a display element layer DP-OLED, and an encapsulation substrate ES that are disposed on the base layer BL, and a sealant SM that couples the base layer BL and the encapsulation substrate ES.

The base layer BL may include at least one plastic film. The base layer BL may include a plastic substrate, a glass substrate, a metal substrate, an organic/inorganic composite material substrate, and/or the like. In the illustrated embodiment, the base layer BL may be a thin glass substrate having a thickness of tens to hundreds of micrometers. The base layer BL may have a multilayer structure. For example, the base layer BL may include a polyimide film/at least one inorganic layer/a polyimide film.

The circuit element layer DP-CL includes at least one insulating layer and a circuit element. The insulating layer includes at least one inorganic layer and at least one organic layer. The circuit element includes signal lines, a pixel driving circuit, and the like. A description thereof in more detail will be provided below.

The display element layer DP-OLED includes at least a light emitting element. The display element layer DP-OLED may further include an organic layer such as a pixel defining film.

The encapsulation substrate ES may be spaced from (e.g., spaced apart from) the display element layer DP-OLED with a set gap (e.g., a predetermined gap) GP therebetween. The base layer BL and the encapsulation substrate ES may include a plastic substrate, a glass substrate, a metal substrate, an organic/inorganic composite material substrate, or the like. The sealant SM may include an organic adhesive, frit, or the like. The gap GP may also be filled with a set material (e.g., a predetermined material). The gap GP may be filled with a desiccant or a resin material.

As illustrated in FIG. 2D, a display panel DP includes a base layer BL, and a circuit element layer DP-CL, a display element layer DP-OLED, and an upper insulating layer TFL that are disposed on the base layer BL. The upper insulating layer TFL includes a plurality of thin films. The upper insulating layer TFL may include a protective layer for protecting a light emitting element. The upper insulating layer TFL may include a thin film encapsulation layer including at least an inorganic layer/an organic layer/an inorganic layer (i.e., a multilayer structure including an inorganic layer/an organic layer/an inorganic layer). The thin film encapsulation layer may be disposed on the protective layer.

Figure 3A:
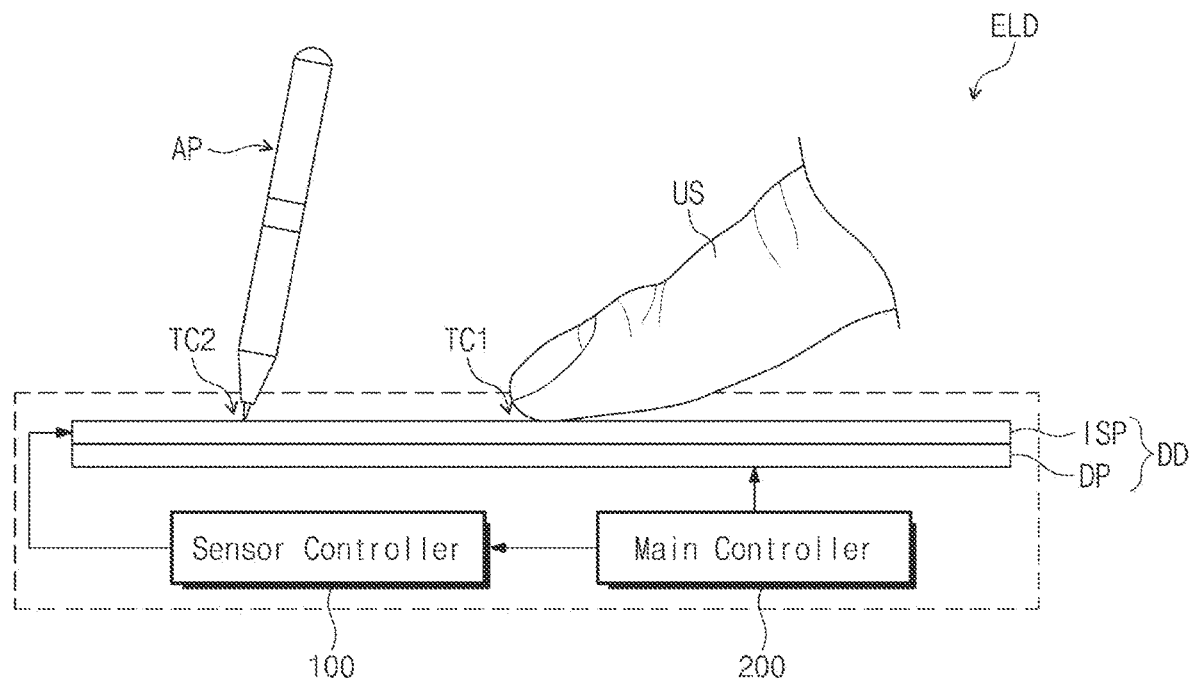
FIG. 3A is a block diagram for describing an operation of an electronic device according to an embodiment of the inventive concept.
Figure 3B:
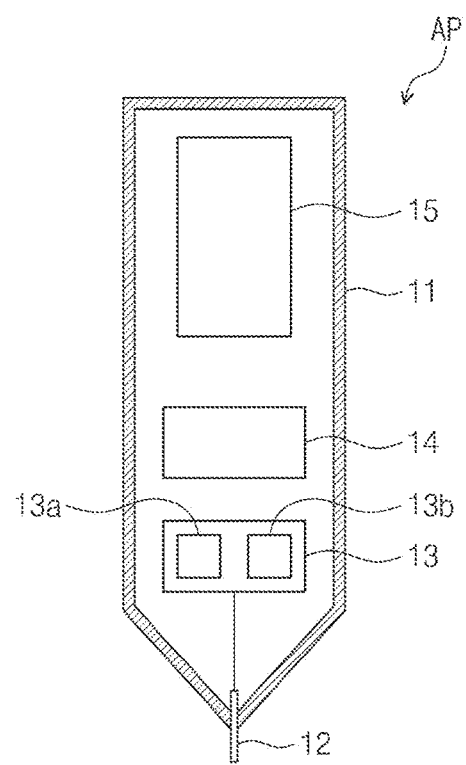
FIG. 3B is a block diagram of an input device illustrated in FIG. 3A according to an embodiment of the present inventive concept.

FIG. 3A is a block diagram for describing an operation of the electronic device ELD according to an embodiment of the present inventive concept, and FIG. 3B is a block diagram of the input device AP illustrated in FIG. 3A according to an embodiment of the present inventive concept.

Referring to FIG. 3A and FIG. 3B, the electronic device ELD according to an embodiment of the present inventive concept may include a main controller 200 for controlling driving of the display device DD and a sensor controller 100 connected to the input sensor ISP. The main controller 200 may control driving of the sensor controller 100. In an embodiment of the present inventive concept, the main controller 200 and the sensor controller 100 may be mounted on the main circuit board MCB (e.g., see FIG. 1B). In an embodiment of the present inventive concept, the sensor controller 100 may be embedded in the driving chip DIC (e.g., see FIG. 1B).

The input sensor ISP may include sensing electrodes. The sensing electrodes may include first sensing electrodes and second sensing electrodes. The structure of the input sensor ISP will be described in more detail below.

The sensor controller 100 may be connected to the sensing electrodes of the input sensor ISP. The sensor controller 100 may operate the input sensor ISP in a first mode to sense the first input TC1 (e.g., see FIG. 1A) and may operate the input sensor ISP in a second mode to sense the second input TC2 (e.g., see FIG. 1A). Operations of the first mode and the second mode may be performed alternately or may be performed in different periods in or according to a preset method.

As illustrated in FIG. 3B, the input device AP may include a housing 11, a conductive tip 12, and a communication module 13. The housing 11 may have a pen shape and may have an accommodation space formed therein. The conductive tip 12 may protrude outwards from one side of the housing 11 that has an opening. The conductive tip 12 may be a part of the input device AP that contacts (e.g., directly contacts) the input sensor ISP.

The communication module 13 may include a transmitting circuit 13a and a receiving circuit 13b. The transmitting circuit 13a may transmit a downlink signal to the sensor controller 100. The downlink signal may include the position of the input device AP, the tilt of the input device AP, state information, and/or the like. When the input device AP contacts the input sensor ISP, the sensor controller 100 may receive the downlink signal through the input sensor ISP.

The receiving circuit 13b may receive an uplink signal from the sensor controller 100. The uplink signal may include information such as panel information and/or a protocol version. The sensor controller 100 may provide the uplink signal to the input sensor ISP, and the input device AP may receive the uplink signal through contact with the input sensor ISP.

The input device AP further includes an input controller 14 for controlling driving of the input device AP. The input controller 14 may be configured to operate according to a prescribed program. The transmitting circuit 13a receives a signal provided from the input controller 14 to modulate the signal into a signal that may be sensed by the input sensor ISP, and the receiving circuit 13b demodulates a signal received through the input sensor ISP into a signal that may be processed by the input controller 14. The input device AP may further include a power supply module 15 for supplying power to the input device AP.

Figure 4:
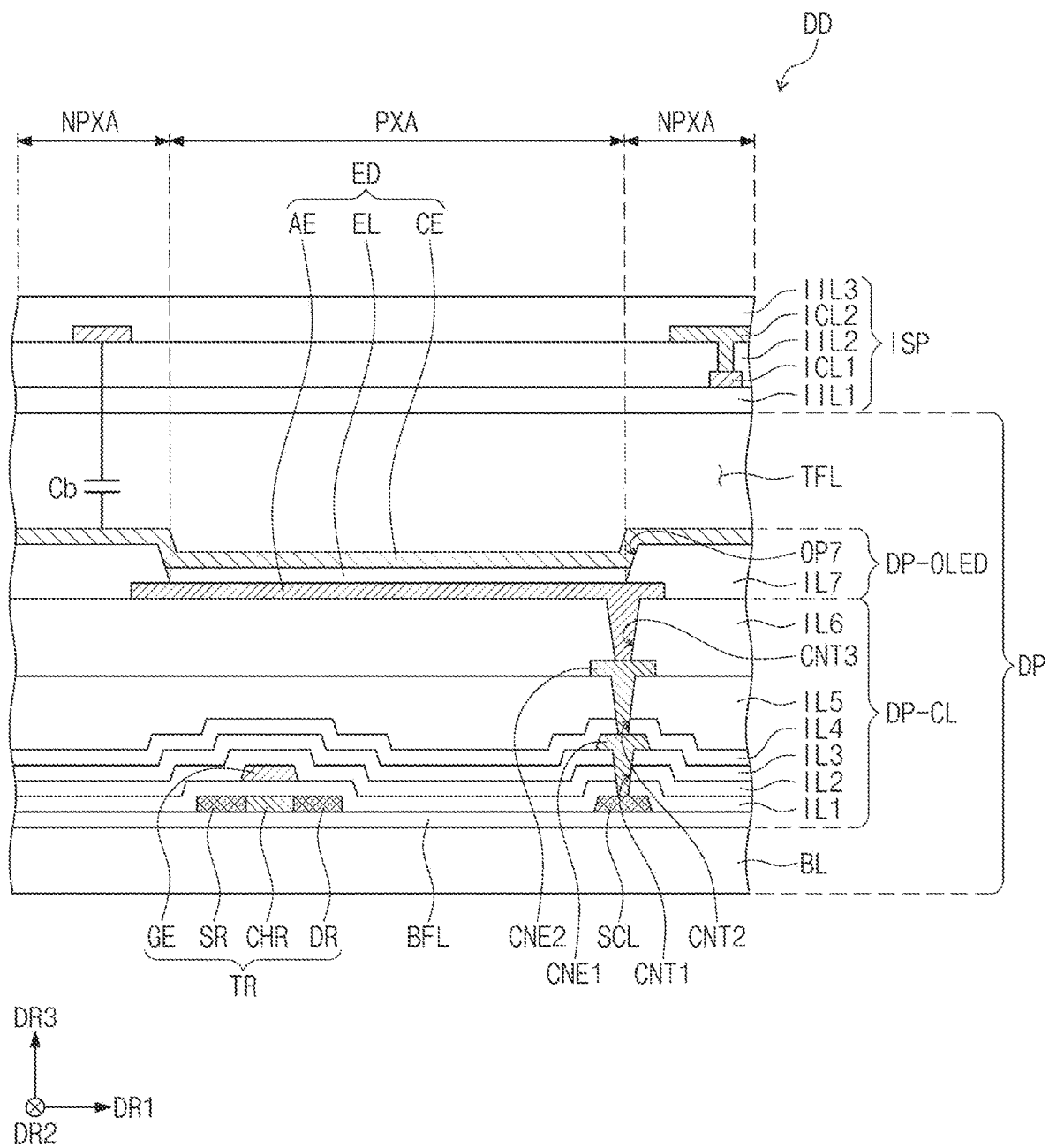
FIG. 4 is an enlarged cross-sectional view of a display device according to an embodiment of the present inventive concept.

FIG. 4 is an enlarged cross-sectional view of the display device DD according to an embodiment of the present inventive concept. FIG. 4 is a view based on a display device DD of FIG. 2D.

Referring to FIG. 4, the display device DD may include the display panel DP and the input sensor ISP disposed (e.g., directly disposed) on the display panel DP. The display panel DP may include the base layer BL, the circuit element layer DP-CL, the display element layer DP-OLED, and the upper insulating layer TFL.

The base layer BL may provide a base surface on which the circuit element layer DP-CL is disposed. The circuit element layer DP-CL may be disposed on the base layer BL. The circuit element layer DP-CL may include an insulating layer, a semiconductor pattern, a conductive pattern, a signal line, and/or the like. The insulating layer, a semiconductor layer, and a conductive layer may be formed on the base layer BL in or according to a method including processes such as coating and/or deposition, and thereafter, the insulating layer, the semiconductor layer, and the conductive layer may be selectively patterned through a plurality of photolithography processes. Thereafter, the semiconductor pattern, the conductive pattern, and the signal line included in the circuit element layer DP-CL may be formed.

At least one inorganic layer is formed on a top surface of the base layer BL. In the illustrated embodiment, the display panel DP is illustrated to include a buffer layer BFL. The buffer layer BFL may improve the bonding force between the base layer BL and the semiconductor pattern. The buffer layer BFL may include a silicon oxide layer and a silicon nitride layer, and the silicon oxide layer and the silicon nitride layer may be alternately laminated.

The semiconductor pattern may be disposed on the buffer layer BFL. The semiconductor pattern may include polysilicon. However, the semiconductor pattern is not limited thereto and may also include amorphous silicon or metal oxide. In other words, the semiconductor pattern may include any suitable material such as polysilicon, amorphous silicon, and/or a metal oxide. In one or more embodiments, a plurality of semiconductor patterns may be provided.

FIG. 4 illustrates only some of the semiconductor patterns, and other ones of the semiconductor patterns may be further disposed in another area. The semiconductor patterns may be arranged in or according to a specific rule across the pixels. The semiconductor pattern may have different electrical properties depending on whether the semiconductor pattern is doped. The semiconductor pattern may include a first region having a high conductivity and a second region having a low conductivity. The first region may be doped with an N-type dopant or a P-type dopant. A P-type transistor includes a doped region doped with the P-type dopant. The second region may be a non-doped region or may be doped in a lower concentration than the first region.

The first region has a higher conductivity than the second region and may substantially serve as an electrode or a signal line. The second region may substantially correspond to an active region (or a channel region) of a transistor TR. In other words, one portion of the semiconductor pattern may be the active region of the transistor, and another portion thereof may be a source region or a drain region of the transistor.

Each of the pixels may have an equivalent circuit including seven transistors, one capacitor, and a light emitting element, and an equivalent circuit diagram of the pixel may be modified into various forms. In FIG. 4, the one transistor TR and a light emitting element ED included in the pixel are illustrated by way of example.

A source region SR, a channel region CHR, and a drain region DR of the transistor TR may be formed from the semiconductor pattern. The source region SR and the drain region DR may be provided in opposite directions from the channel region CHR when viewed on a cross section. For example, the source region SR and the drain region DR may at respective sides of the channel region CHR. FIG. 4 illustrates a portion of a signal transmission area SCL formed from the first region of the semiconductor pattern. In one or more embodiments, the signal transmission area SCL may be connected (e.g., electrically connected) to the transistor TR when viewed in a plane.

A first insulating layer IL1 may be disposed on the buffer layer BFL. The first insulating layer IL1 may overlap the plurality of pixels in common (e.g., the pixels may be overlapped by the same first insulating layer IL1) and cover the semiconductor pattern. The first insulating layer IL1 may include an inorganic layer and/or an organic layer and may have a single-layer structure or a multilayer structure. The first insulating layer IL1 may include at least one of aluminum oxide, titanium oxide, silicon oxide, silicon nitride, silicon oxynitride, zirconium oxide, or hafnium oxide. In the illustrated embodiment, the first insulating layer IL1 may be a single-layer silicon oxide layer. In addition to the first insulating layer IL1, an insulating layer of the circuit element layer DP-CL to be described in more detail below may include an inorganic layer and/or an organic layer and may have a single-layer structure or a multilayer structure. The inorganic layer may include at least one of the above-described materials but is not limited thereto.

A gate GE of the transistor TR is disposed on the first insulating layer IL1. The gate GE may be a portion of a metal pattern. The gate GE overlaps the channel region CHR. In a process of doping the semiconductor pattern, the gate GE may function as a mask.

A second insulating layer IL2 may be disposed on the first insulating layer IL1 and may cover the gate GE. The second insulating layer IL2 may overlap the pixels in common (e.g., the pixels may be overlapped by the same second insulating layer IL2). The second insulating layer IL2 may include an inorganic layer and/or an organic layer and may have a single-layer structure or a multilayer structure. In the illustrated embodiment, the second insulating layer IL2 may be a single-layer silicon oxide layer.

A third insulating layer IL3 may be disposed on the second insulating layer IL2, and in the illustrated embodiment, the third insulating layer IL3 may be a single-layer silicon oxide layer. A first connection electrode CNE1 may be disposed on the third insulating layer IL3. The first connection electrode CNE1 may be connected to the signal transmission area SCL through a contact hole CNT1 penetrating the first, second, and third insulating layers IL1, IL2, and IL3. In one or more embodiments, the first connection electrode CNE1 may overlap the signal transmission area SCL in the third direction DR3 (e.g., a thickness direction of the base layer BL).

A fourth insulating layer IL4 may be disposed on the third insulating layer IL3. The fourth insulating layer IL4 may be a single-layer silicon oxide layer. A fifth insulating layer IL5 may be disposed on the fourth insulating layer IL4. The fifth insulating layer IL5 may be an organic layer.

A second connection electrode CNE2 may be disposed on the fifth insulating layer IL5. The second connection electrode CNE2 may be connected to the first connection electrode CNE1 through a contact hole CNT2 penetrating the fourth insulating layer IL4 and the fifth insulating layer IL5. In one or more embodiments, the second connection electrode CNE2 may overlap the first connection electrode CNE1 in the third direction DR3 (e.g., the thickness direction of the base layer BL).

A sixth insulating layer IL6 may be disposed on the fifth insulating layer IL5 and may cover the second connection electrode CNE2. The sixth insulating layer IL6 may be an organic layer. The display element layer DP-OLED may be disposed on the circuit element layer DP-CL. The display element layer DP-OLED may include the light emitting element ED. The light emitting element ED may include a first electrode AE, a light emitting layer EL, and a second electrode CE. For example, the light emitting layer EL may include an organic light emitting material, a quantum dot, a quantum rod, a micro LED, or a nano LED.

The first electrode AE may be disposed on the sixth insulating layer IL6. The first electrode AE may be connected to the second connection electrode CNE2 through a contact hole CNT3 penetrating the sixth insulating layer IL6.

A pixel defining film IL7 may be disposed on the sixth insulating layer IL6 and may cover a portion of the first electrode AE. An opening OP7 is defined in the pixel defining film IL7. The opening OP7 of the pixel defining film IL7 exposes at least a portion of the first electrode AE. In the illustrated embodiment, a light emitting area PXA is defined to correspond to the portion of the first electrode AE exposed by the opening OP7. A non-light emitting area NPXA may surround the light emitting area PXA.

The light emitting layer EL may be disposed on the first electrode AE. The light emitting layer EL may be disposed in the opening OP7. That is, the light emitting layer EL may be formed separately in each of the pixels. Accordingly, a plurality of light emitting layers EL may be provided. When the light emitting layer EL is formed separately in each of the pixels, each of the light emitting layers EL may emit a light (e.g., a light beam) having at least one color of a blue color, a red color, or a green color. However, the light emitting layer EL is not limited thereto and may also be connected to pixels and provided to the pixels in common (e.g., the pixels may share a light emitting layer EL). In this case, the light emitting layer EL may provide blue light or white light.

The second electrode CE may be disposed on the light emitting layer EL. The second electrode CE may have an integral shape and may be disposed in common in the plurality of pixels (e.g., the pixels may share the second electrode CE). A common voltage may be provided to the second electrode CE, and the second electrode CE may be referred to as a common electrode.

In one or more embodiments, a hole control layer may be disposed between the first electrode AE and the light emitting layer EL. The hole control layer may be disposed in common in the light emitting area PXA and the non-light emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be formed in the pixels in common by using an open mask.

The input sensor ISP may be directly formed on a top surface of the upper insulating layer TFL through a continuous process or a substantially continuous process. The input sensor ISP may include a first sensor insulating layer IIL1, a first conductive layer ICL1, a second sensor insulating layer IIL2, a second conductive layer ICL2, and a third sensor insulating layer IIL3. The first sensor insulating layer IIL1 may be omitted in an embodiment of the present inventive concept.

Each of the first conductive layer ICL1 and the second conductive layer ICL2 may have a single-layer structure or may include a plurality of patterns having a multilayer structure laminated in the third direction DR3. The conductive layer of the single-layer structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), and/or indium zinc tin oxide (IZTO). In addition, the transparent conductive layer may include a conductive polymer such as PEDOT, metal nanowires, graphene, and/or the like.

The conductive layer of the multilayer structure may include metal layers. The metal layers may have a three-layer structure of, for example, titanium/aluminum/titanium. The conductive layer of the multilayer structure may include at least one metal layer and at least one transparent conductive layer.

The second sensor insulating layer IIL2 covers the first conductive layer ICL1, and the third sensor insulating layer IIL3 covers the second conductive layer ICL2. The first sensor insulating layer IIL1 to the third sensor insulating layer IIL3 (i.e., the first sensor insulating layer IIL1, the second sensor insulating layer IIL2, and the third sensor insulating layer IIL3) are each illustrated as a single layer but are not limited thereto.

At least one of the first sensor insulating layer IIL1 and the second sensor insulating layer IIL2 may include an inorganic film. The inorganic film may include at least one of aluminum oxide, titanium oxide, silicon oxide, silicon nitride, silicon oxynitride, zirconium oxide, or hafnium oxide.

The third sensor insulating layer IIL3 may include an organic film. The organic film may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, or perylene-based resin.

As the distance between the display element layer DP-OLED and the input sensor ISP decreases, the input sensor ISP may be greatly affected by a signal provided from the display element layer DP-OLED. Capacitance of a load capacitor Cb formed between the first conductive layer ICL1 and/or the second conductive layer ICL2 and the second electrode CE changes according to an operation of the display element layer DP-OLED. An interfering signal from the display element layer DP-OLED may function as noise to the input sensor ISP.

Figure 5:
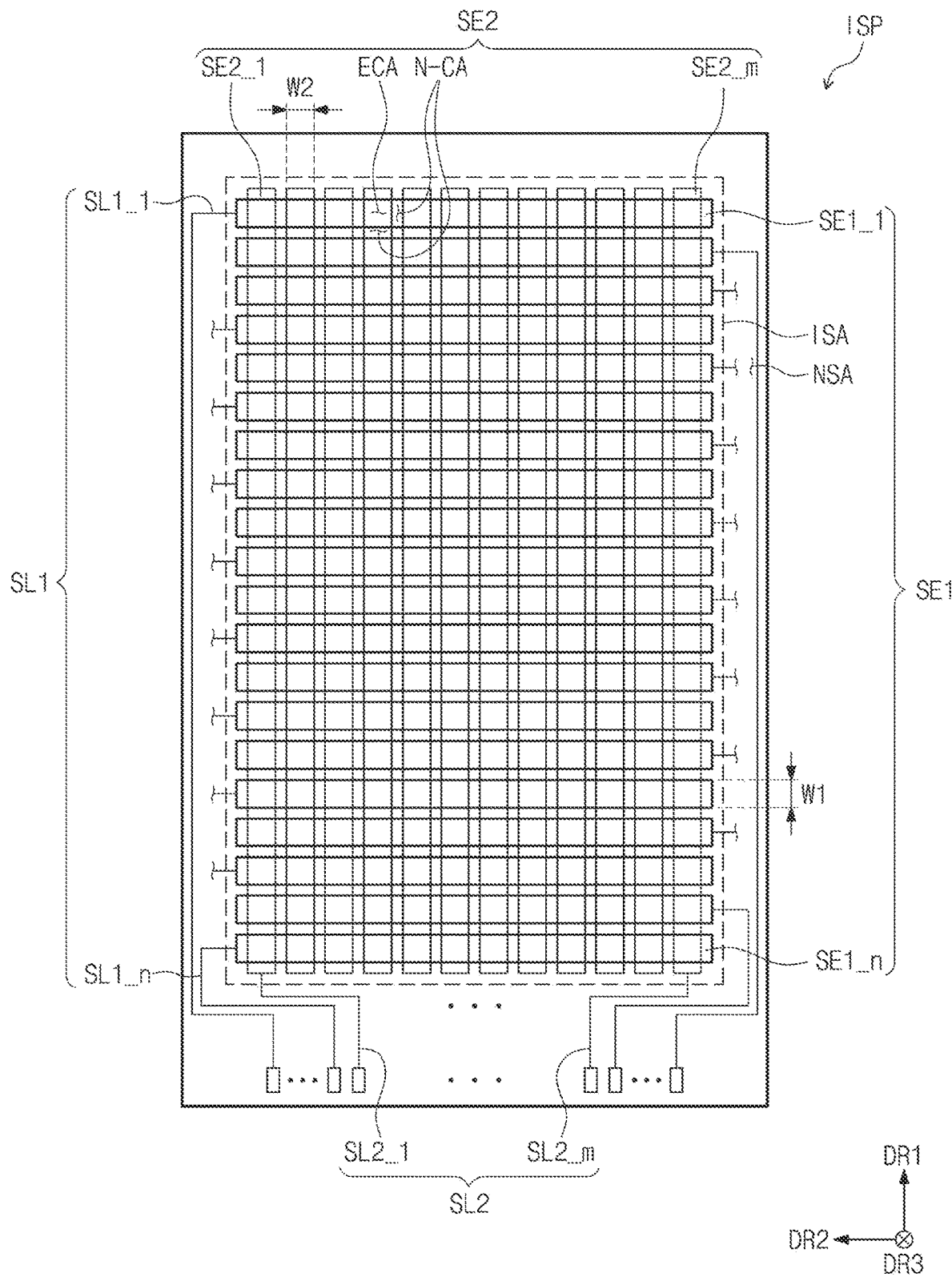
FIG. 5 is a plan view illustrating an input sensor according to an embodiment of the present inventive concept.
Figure 6:
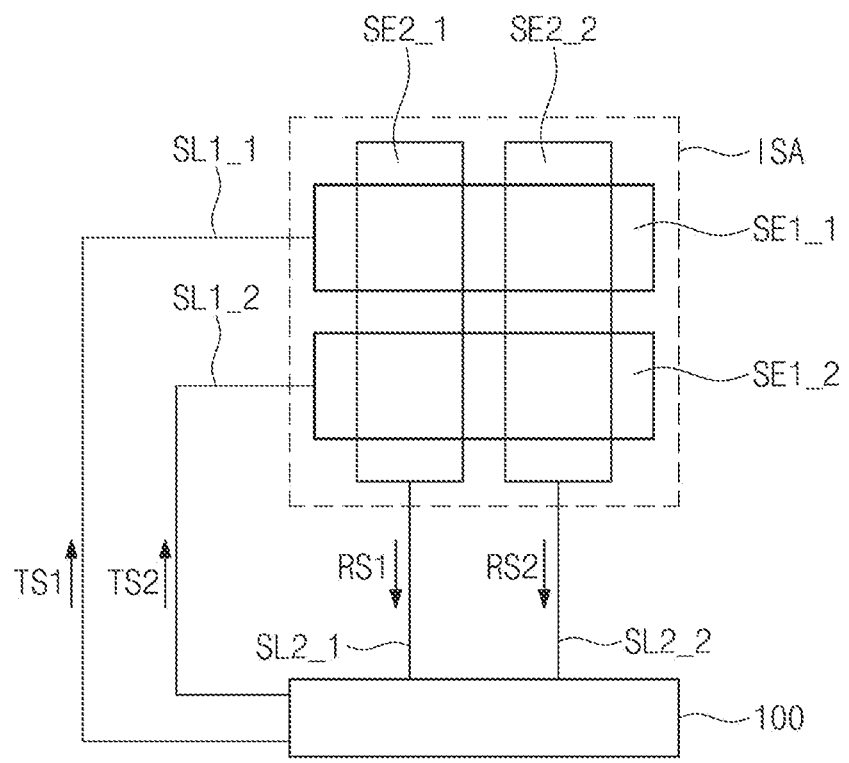
FIG. 6 is a view for describing an operation in a first mode of an input sensor according to an embodiment of the present inventive concept.
Figure 7A:
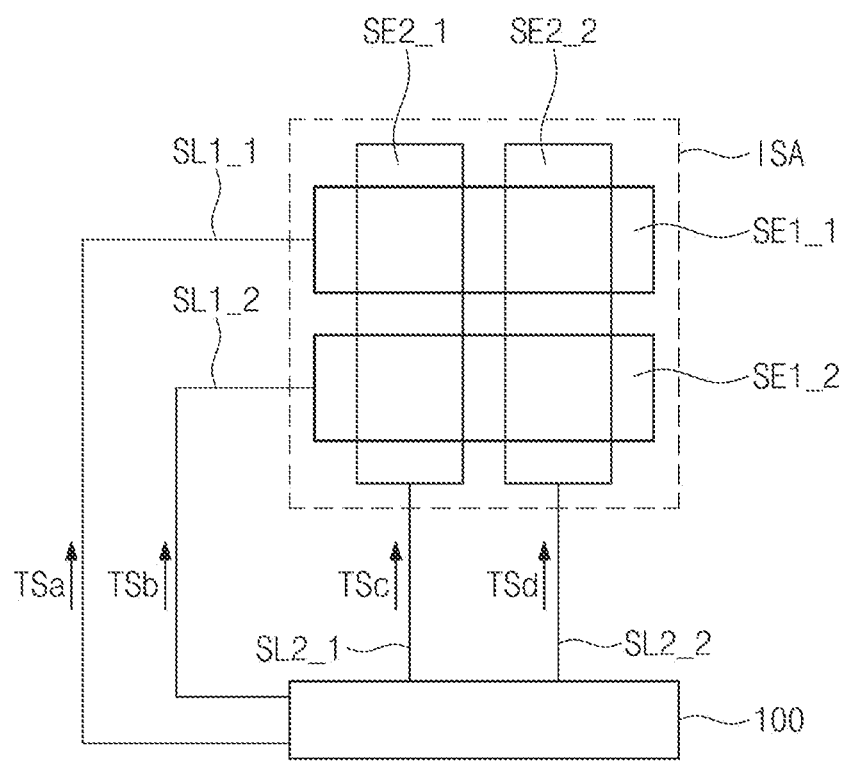
FIG. 7A and FIG. 7B are views for describing an operation in a second mode of an input sensor according to embodiments of the present inventive concept.
Figure 7B:
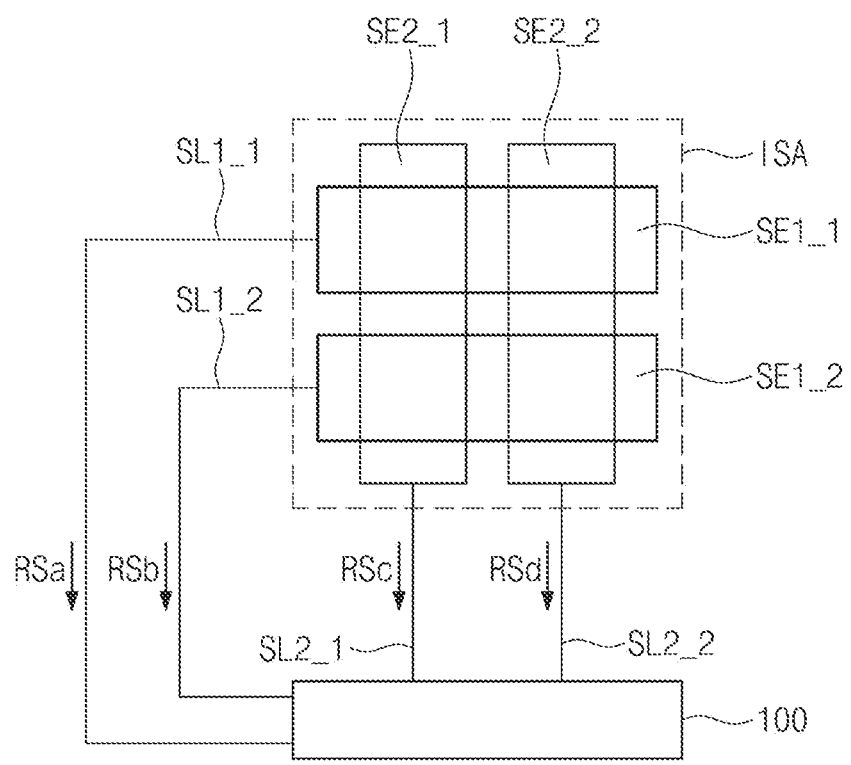

FIG. 5 is a plan view illustrating the input sensor ISP according to an embodiment of the present inventive concept. FIG. 6 is a view for describing an operation in the first mode of the input sensor ISP according to an embodiment of the present inventive concept. FIG. 7A and FIG. 7B are views for describing an operation in the second mode of the input sensor ISP according to embodiments of the present inventive concept. Hereinafter, the input sensor ISP will be described in more detail with additional reference to FIG. 3A.

Referring to FIG. 3A and FIG. 5, the input sensor ISP may include a sensing area ISA and a non-sensing area NSA. The sensing area ISA and the non-sensing area NSA may respectively correspond to the active area AA and the peripheral area NAA of the display device DD illustrated in FIG. 1B.

The input sensor ISP includes first sensing electrodes SE1_1 to SE1_n (hereinafter referred to as first electrodes SE1) and second sensing electrodes SE2_1 to SE2_m (hereinafter referred to as second electrodes SE2). The first electrodes SE1 and the second electrodes SE2 are electrically insulated from each other and cross each other. Each of areas where the first electrodes SE1 cross the second electrodes SE2 may be defined as a crossing area ECA. Each of areas where the first electrodes SE1 do not cross the second electrodes SE2 may be defined as a non-crossing area N-CA. As the widths of the first electrodes SE1 and the second electrodes SE2 increase, the non-crossing area N-CA is reduced. In the illustrated embodiment, the first electrodes SE1 are shorter than and are provided in a larger number than the second electrodes SE2, but the present inventive concept is not limited thereto. In other words, in one or more embodiments, the length of the first electrodes SE1 in the second direction DR2 may be less than the length of the second electrodes SE2 in the first direction, and the first electrodes SE1 are greater in number than the second electrodes SE2.

Each of the first electrodes SE1 may have a bar shape or a stripe shape and may extend in the second direction DR2. The first electrodes SE1 may be arranged to be spaced from (e.g., spaced apart from) each other in the first direction DR1. The first electrodes SE1 may have a substantially constant width W1 in the first direction DR1. The first electrodes SE1 may have the constant width W1 in the crossing area ECA and the non-crossing area N-CA. A separation distance between the first electrodes SE1 (e.g., adjacent ones of the first electrodes SE1) in the first direction DR1 may be constant.

Each of the second electrodes SE2 may have a bar shape or a stripe shape and may extend in the first direction DR1. The second electrodes SE2 may be arranged to be spaced from (e.g., spaced apart from) each other in the second direction DR2. The second electrodes SE2 may have a substantially constant width W2 in the second direction DR2. The second electrodes SE2 may have the constant width W2 in the crossing area ECA and the non-crossing area N-CA. A separation distance between the second electrodes SE2 (e.g., adjacent ones of the second electrodes SE2) in the second direction DR2 may be constant.

The input sensor ISP may further include a plurality of first sensing signal lines SL1_1 to SL1_n (hereinafter referred to as first signal lines SL1) and a plurality of second sensing signal lines SL2_1 to SL2_m (hereinafter referred to as second signal lines SL2). The first signal lines SL1 and the second signal lines SL2 may be disposed in the non-sensing area NSA. The first signal lines SL1 may be connected (e.g., electrically connected) to at least one sides, respectively, of both sides of the first electrodes SE1, and the second signal lines SL2 may be connected (e.g., electrically connected) to one sides, respectively, of the second electrodes SE2.

The first electrodes SE1 are connected (e.g., electrically connected) to the sensor controller 100 (e.g., see FIG. 3A) through the first signal lines SL1, and the second electrodes SE2 are connected (e.g., electrically connected) to the sensor controller 100 through the second signal lines SL2.

In the first mode of an embodiment of the present inventive concept, one of the first electrodes SE1 and the second electrodes SE2 may operate as transmitting electrodes, and the other thereof may operate as receiving electrodes. The input sensor ISP may operate in the first mode in which information about the first input TC1 (e.g., see FIG. 3A) is obtained through a change in mutual capacitance between the first electrodes SE1 and the second electrodes SE2, or may operate in the second mode in which the second input TC2 (e.g., see FIG. 3A) is sensed through a change in capacitance of each of the first electrodes SE1 and the second electrodes SE2.

FIGS. 6-7B schematically illustrate two first electrodes SE1_1 and SE1_2 of the first electrodes SE1 and two second electrodes SE2_1 and SE2_2 of the second electrodes SE2. In FIG. 6, the second electrodes SE2_1 and SE2_2 are illustrated as the receiving electrodes.

Referring to FIG. 6, the sensor controller 100 may provide driving signals TS1 and TS2 to the first electrodes SE1_1 and SE1_2, respectively, in the first mode. Although the driving signals TS1 and TS2 are illustrated to be provided to one end of a corresponding one of the first electrodes SE1_1 and SE1_2, each of the driving signals TS1 and TS2 may be concurrently (e.g., simultaneously) provided to both ends of a corresponding one of the first electrodes SE1_1 and SE1_2. In the first mode, the sensor controller 100 may receive sensing signals RS1 and RS2 from the second electrodes SE2_1 and SE2_2, respectively. Accordingly, the sensor controller 100 may compare the driving signals TS1 and TS2 with the sensing signals RS1 and RS2 corresponding thereto and generate, on the basis of the amount of change thereof, a coordinate value for a position to which the first input TC1 is provided.

Referring to FIG. 7A and FIG. 7B, when the input device AP gets close to the input sensor ISP, the input sensor ISP may enter the second mode for sensing the second input TC2. The input device AP may transmit and/or receive data to and/or from the sensor controller 100 through the input sensor ISP.

In the second mode, at least one of the first electrodes SE1_1 and SE1_2 and the second electrodes SE2_1 and SE2_2 may be used as the transmitting electrodes for providing the input device AP with uplink signals TSa, TSb, TSc, and TSd provided from the sensor controller 100. In the second mode, the first electrodes SE1_1 and SE1_2 and the second electrodes SE2_1 and SE2_2 may be used as the receiving electrodes for respectively providing the sensor controller 100 with downlink signals RSa, RSb, RSc, and RSd provided from the input device AP. That is, all of the first electrodes SE1_1 and SE1_2 and the second electrodes SE2_1 and SE2_2 may be used in the second mode as the transmitting electrodes or as the receiving electrodes.

Because each of the first electrodes SE1_1 and SE1_2 and the second electrodes SE2_1 and SE2_2 has a bar shape, the amount of change in mutual capacitance between the first electrodes SE1_1 and SE1_2 and the second electrodes 5E2_1 and SE2_2 may be maintained substantially constant even when the input device AP moves. Accordingly, the movement of the second input TC2 may be accurately sensed in the second mode even when the second input TC2 moves. That is, the second input TC2 is not distorted when provided in a line shape as in the case of writing a letter or drawing a picture using the input device AP. As a result, linearity of the second input TC2 may be improved.

Figure 8A:
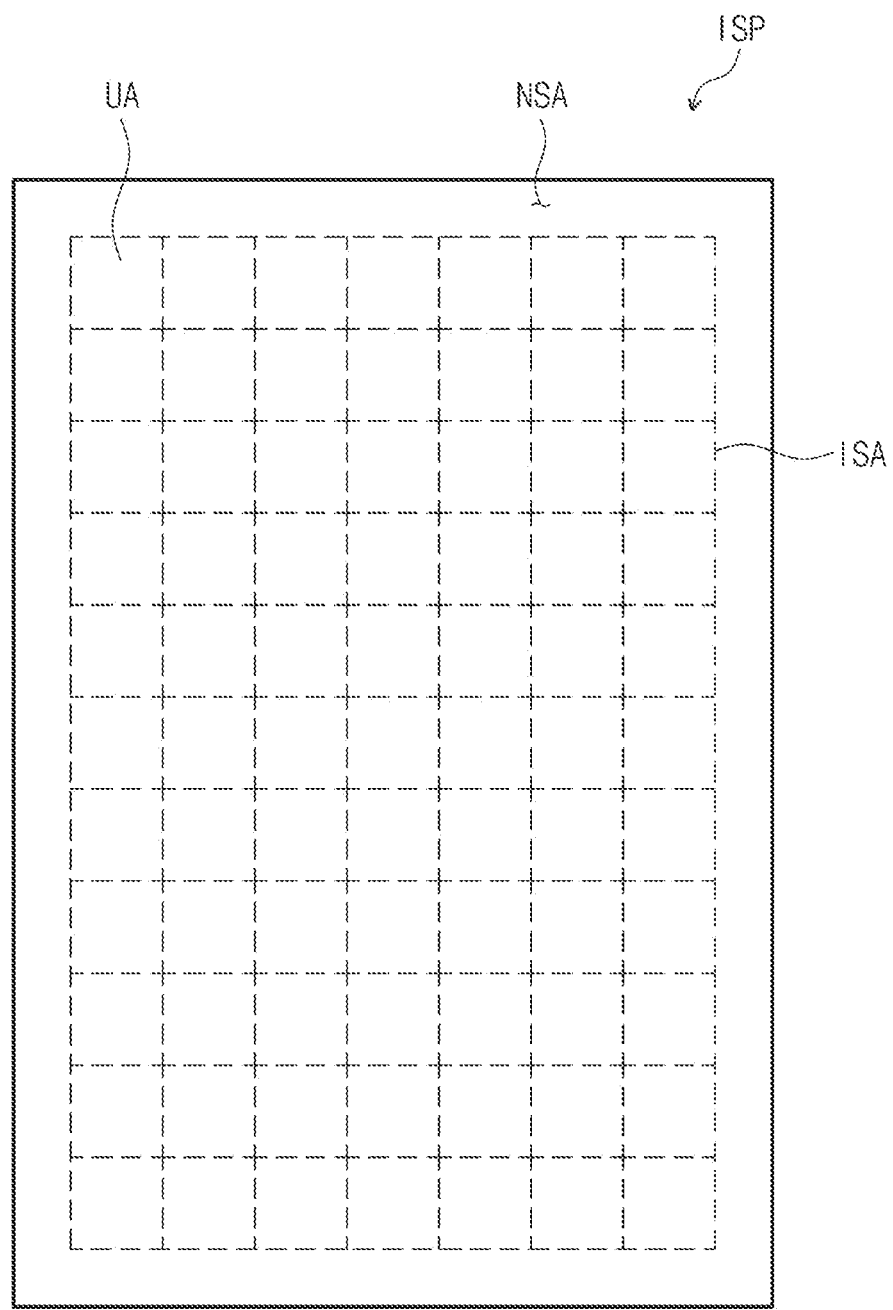
FIG. 8A is a schematic plan view of the input sensor illustrated in FIG. 5 according to an embodiment of the present inventive concept.
Figure 8B:
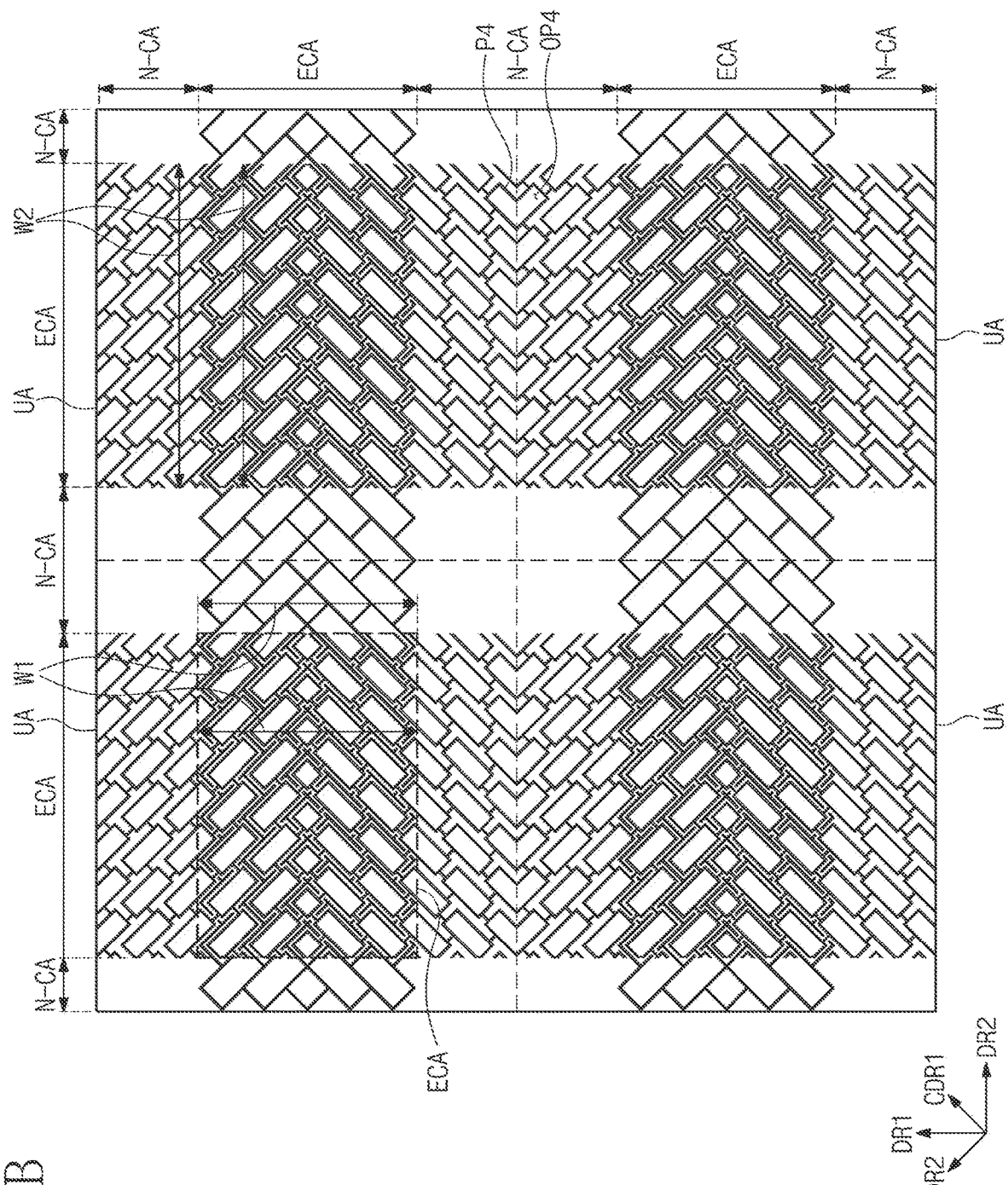
FIG. 8B is an enlarged plan view of four of the unit sensing areas illustrated in FIG. 8A according to an embodiment of the present inventive concept.
Figure 8C:
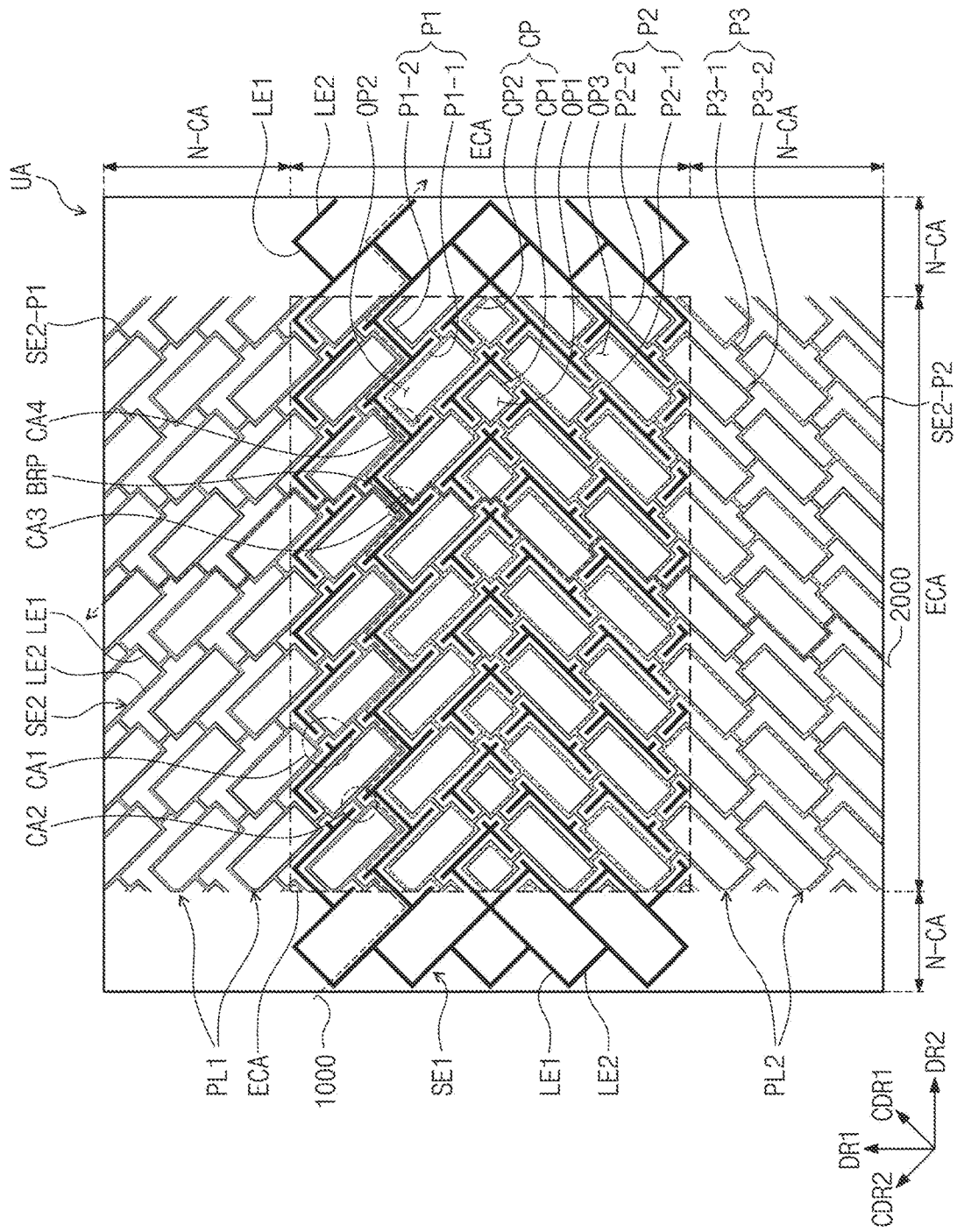
FIG. 8C is an enlarged plan view of one of the unit sensing areas illustrated in FIG. 8B according to an embodiment of the present inventive concept.
Figure 8D:
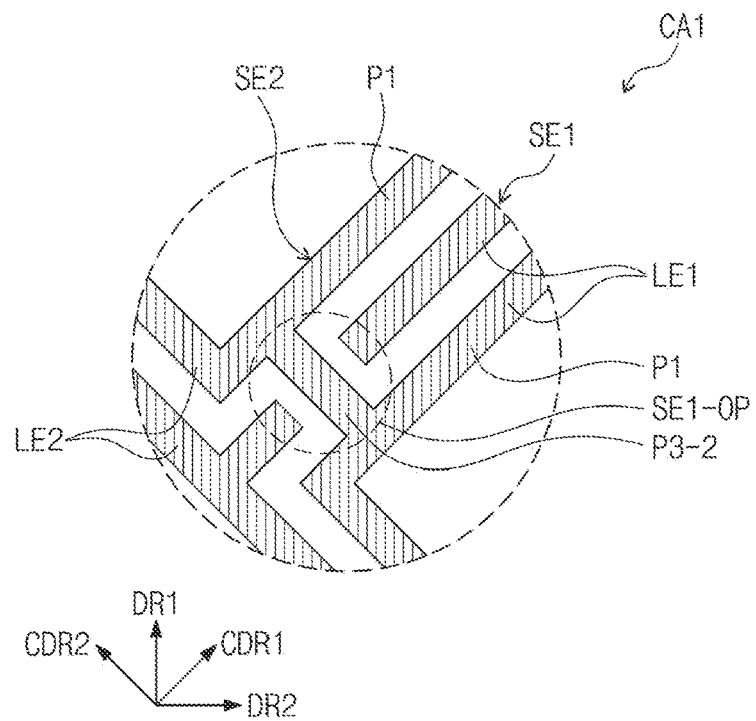
FIG. 8D is a plan view illustrating an example of the first area illustrated in FIG. 8C according to an embodiment of the present inventive concept.
Figure 8E:
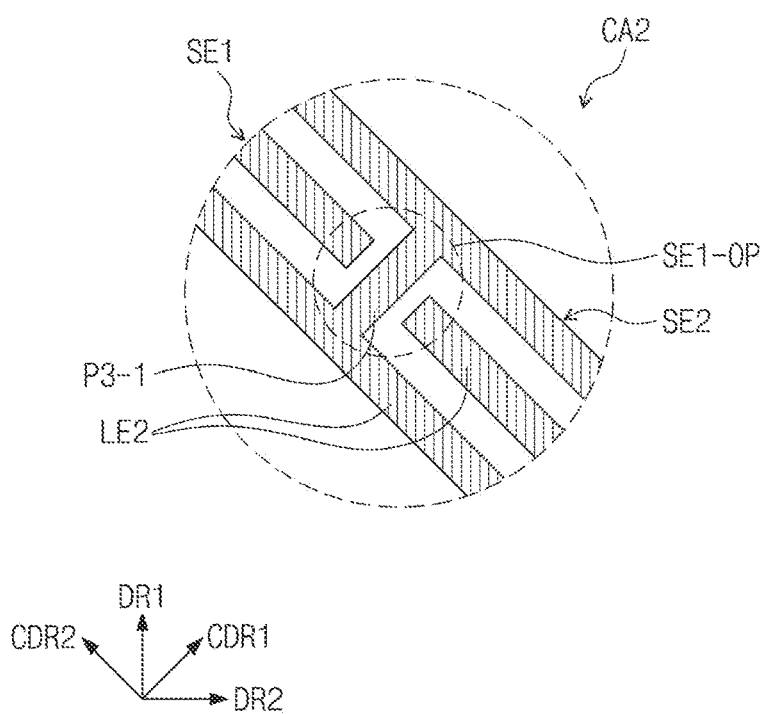
FIG. 8E is a plan view illustrating an example of the second area illustrated in FIG. 8C according to an embodiment of the present inventive concept.
Figure 8F:
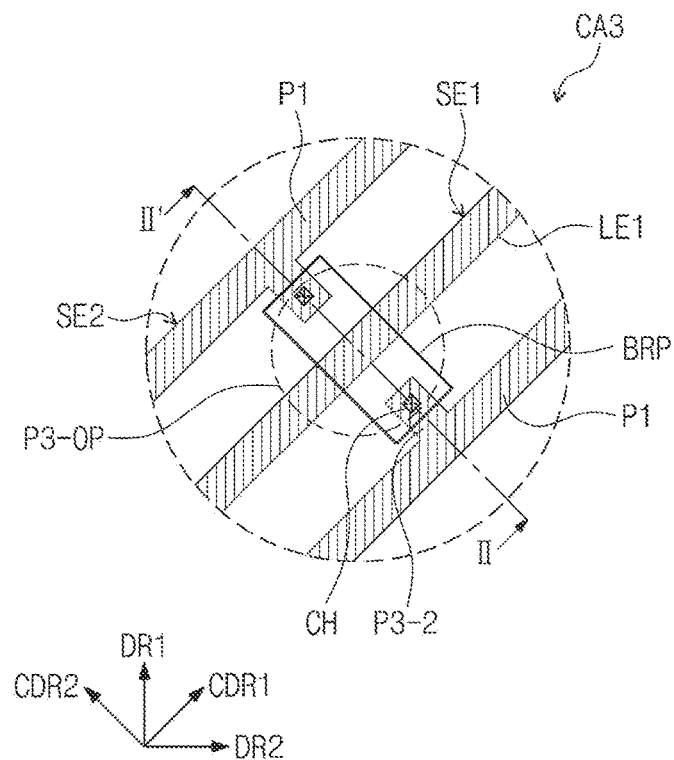
FIG. 8F is a plan view illustrating an example of the third area illustrated in FIG. 8C according to an embodiment of the present inventive concept.
Figure 8G:
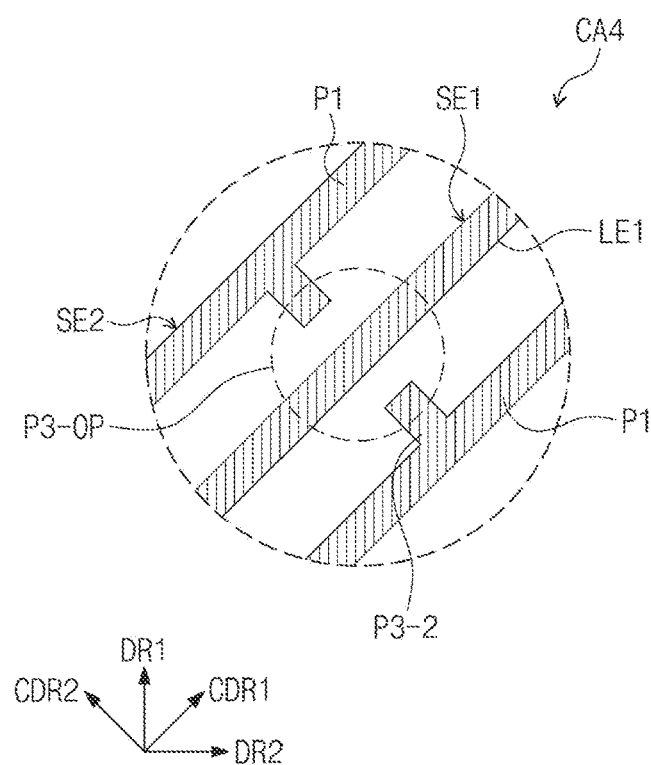
FIG. 8G is a plan view illustrating an example of a fourth area illustrated in FIG. 8C according to an embodiment of the present inventive concept.
Figure 8H:
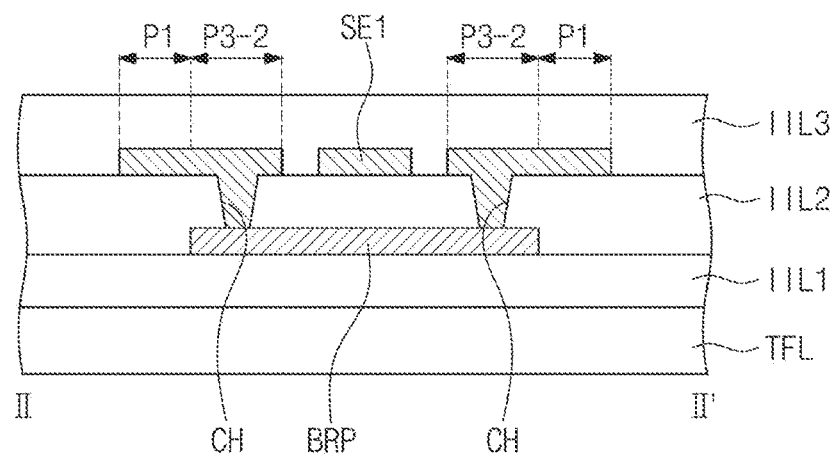
FIG. 8H is a cross-sectional view taken along the line II-II' of FIG. 8F according to an embodiment of the present inventive concept.
Figure 8I:
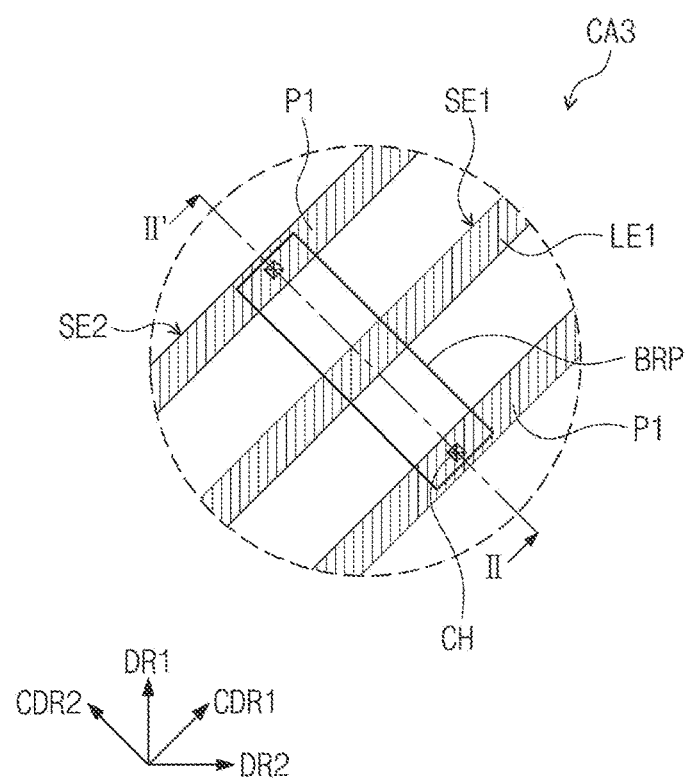
FIG. 8I and FIG. 8J are each a plan view illustrating an example of the third area illustrated in FIG. 8C according to embodiments of the present inventive concept.
Figure 8J:
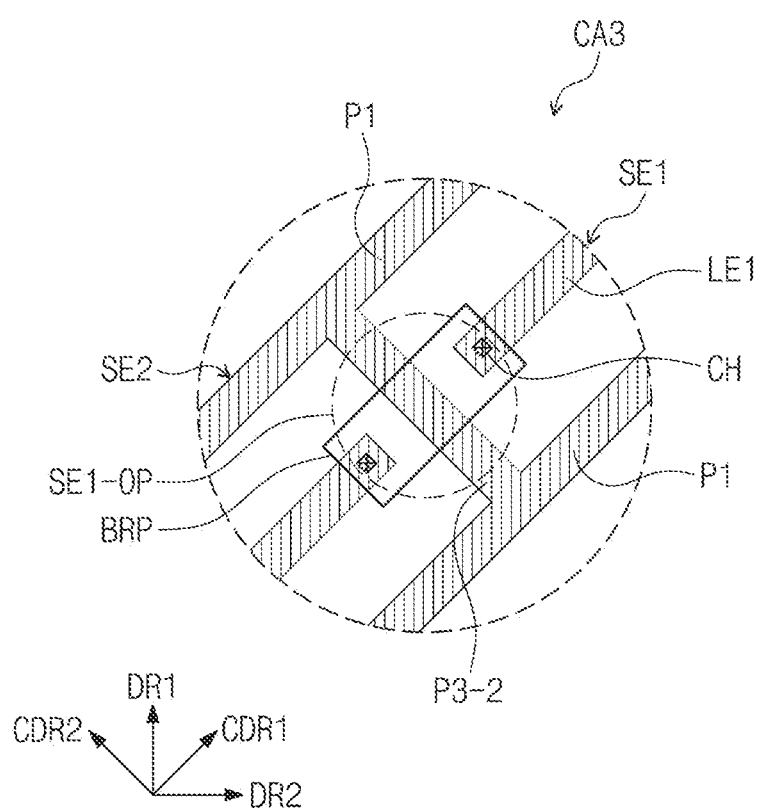

FIG. 8A is a schematic plan view of the input sensor ISP illustrated in FIG. 5. FIG. 8B is an enlarged plan view of four of the unit sensing areas UA illustrated in FIG. 8A. FIG. 8C is an enlarged plan view of one of the unit sensing areas UA illustrated in FIG. 8B. FIG. 8D is a plan view illustrating an example of the first area CA1 (or first open area) illustrated in FIG. 8C. FIG. 8E is a plan view illustrating an example of the second area CA2 (or second open area) illustrated in FIG. 8C. FIG. 8F is a plan view illustrating an example of the third area CA3 (or third open area) illustrated in FIG. 8C. FIG. 8G is a plan view illustrating an example of a fourth area CA4 (or fourth open area) according to an embodiment of the present inventive concept. FIG. 8H is a cross-sectional view taken along the line II-II' of FIG. 8F. FIG. 8I and FIG. 8J are each a plan view illustrating an example of the third area CA3 illustrated in FIG. 8C.

Referring to FIG. 8A, the sensing area ISA includes the plurality of unit sensing areas UA. The plurality of unit sensing areas UA are arranged in a matrix form defined by the first direction DR1 and the second direction DR2. In other words, the plurality of unit sensing areas UA are arranged along the first direction DR1 and the second direction DR2 in a matrix form. The unit sensing areas UA may form sensing columns each extending in the first direction DR1 and sensing rows each extending in the second direction DR2. In other words, the plurality of unit sensing areas UA may be arranged along the first direction DR1 to form a sensing column and may be arranged along the second direction DR2 to form a sensing row. Although the input sensor ISP is illustrated as an example in which the entirety of the sensing area ISA is constituted of only the unit sensing areas UA, the input sensor ISP is not limited thereto. In an embodiment of the present inventive concept, the input sensor ISP may include a first sensing area and a second sensing area which are distinguished from each other. The first sensing area may be constituted of only the unit sensing areas UA, and the second sensing area disposed outside the first sensing area may include an area other than the unit sensing areas UA or include a unit sensing area different from each of the unit sensing areas UA. In other words, at least a portion of the sensing area ISA may be uniformly divided or substantially uniformly divided into the unit sensing areas UA.

Each of the unit sensing areas UA includes at least the crossing area ECA illustrated in FIG. 5. Depending on, in the unit sensing area UA, the percentage of the surface area of each of the areas where the first electrodes SE1 cross the second electrodes SE2, the unit sensing area UA may include only the crossing area ECA or may further include the non-crossing area N-CA of the first electrodes SE1 and the second electrodes SE2.

Referring to FIG. 8B, illustrated are two first electrodes SE1 and two second electrodes SE2 disposed in the four unit sensing areas UA. The width W1 of each of the first electrodes SE1 in the crossing area ECA is substantially the same as the width W1 of the first electrode SE1 in the non-crossing area N-CA, and the width W2 of each of the second electrodes SE2 in the crossing area ECA is substantially the same as the width W2 of the second electrode SE2 in the non-crossing area N-CA.

Each of the first electrode SE1 and the second electrode SE2 may include a relatively wide area and a relatively narrow area due to the bend of a pattern, but the width is measured on the basis of points having the same shape of the bend of the pattern after comparing the crossing area ECA and the non-crossing area N-CA. Because the widths of the crossing area ECA and the non-crossing area N-CA are substantially the same, the shapes of the first electrodes SE1 and the second electrodes SE2 may be defined as a bar shape or a stripe shape. In one or more embodiments, dummy electrodes may be further disposed in the input sensor ISP according to the illustrated embodiment in order to remove a difference in visibility between an area where the first electrodes SE1 and the second electrodes SE2 are not disposed and an area where the first electrodes SE1 and the second electrodes SE2 are disposed.

Referring to FIG. 8C, the first electrode SE1 and the second electrode SE2 have a mesh shape. Each of the first electrode SE1 and the second electrode SE2 substantially includes a plurality of first line elements LE1 each extending in a first crossing direction CDR1 which crosses the first and second directions DR1 and DR2 and a plurality of second line elements LE2 each extending in a second crossing direction CDR2 which crosses the first crossing direction CDR1. The first line elements LE1 and the second line elements LE2 define or form patterns constituting the first electrode SE1 and the second electrode SE2. In one or more embodiments, an angle formed between a first line element LE1 and a second line elements LE2 may be a right angle (i.e., an angle of 90 degrees) or substantially right angle.

Referring to FIG. 8C, in the unit sensing area UA, the second electrode SE2 includes a plurality of center patterns CP, a plurality of first patterns P1, a plurality of second patterns P2, and a plurality of third patterns P3. In the crossing area ECA, the line elements LE1 and LE2 of the first electrode SE1 are disposed in at least some of areas between two adjacent patterns from among the plurality of center patterns CP, the plurality of first patterns P1, the plurality of second patterns P2, and the plurality of third patterns P3. As the gaps between the line elements LE1 and LE2 of the first electrode SE1 and the line elements LE1 and LE2 of the second electrode SE2 become narrower, and the lengths of areas where the line elements LE1 and LE2 of the first electrode SE1 face the line elements LE1 and LE2 of the second electrode SE2 increase, mutual capacitance between the first electrode SE1 and the second electrode SE2 increases. This also increases the amount of change in capacitance between before and after application of an input by the input device of the passive type. As a result, input sensitivity for the input device of the passive type is improved.

The center patterns CP are arranged in or along the second direction DR2 and each provide a first opening OP1. Eight center patterns CP are illustrated by way of example. In the illustrated embodiment, two groups of the center patterns CP are illustrated. Center patterns of a first group CP1 may have the same shape (e.g., the same shape as each other), and center patterns of a second group CP2 may have shapes different from the shape of each of the center patterns of the first group CP1. The center patterns of the first group CP1 may have a quadrangular shape. In the illustrated embodiment, the center patterns of the first group CP1 are illustrated as having a rhombus shape. The center patterns of the first group CP1 may have a square shape in the illustrated embodiment.

The center patterns of the second group CP2 may have shapes each obtained by removing or omitting a portion of any one of the center patterns of the first group CP1. In the illustrated embodiment, illustrated are two center patterns of the second group CP2 which are disposed on respective sides of the center patterns of the first group CP1 and have different shapes (e.g., different shapes from the center patterns of the first group CP1 and/or each other). In some embodiments of the present inventive concept, all of the center patterns CP may also have the same shape (e.g., the same shape as each other). In other words, in one or more embodiments, the center patterns of the first group CP1 and the center patterns of the second group CP2 may have the same shape as each other.

The first patterns P1 are disposed on or at one side of the center patterns CP in the first direction DR1. The first patterns P1 may define or form a plurality of first pattern rows PL1. The first pattern rows PL1 are arranged in the first direction DR1. In each of the first pattern rows PL1, the first patterns P1 may be arranged in or along the second direction DR2 and may each provide a second opening OP2.

In the illustrated embodiment, two groups of the first patterns P1 are illustrated. First patterns of a first group P1-1 may have the same shape (e.g., the same shape as each other), and first patterns of a second group P1-2 may have shapes different from the shape of each of the first patterns of the first group P1-1. The first patterns of the first group P1-1 may each have a quadrangular shape. In the illustrated embodiment, the first patterns of the first group P1-1 are illustrated as each having a rectangular shape. The first patterns of the first group P1-1 may each have a shape extending in the second crossing direction CDR2. For example, the long sides of the first patterns of the first group P1-1 may be parallel or substantially parallel to the second crossing direction CDR2.

The first patterns of the second group P1-2 may have shapes each obtained by removing or omitting a portion of any one of the first patterns of the first group P1-1. In the illustrated embodiment, illustrated are two first patterns of the second group P1-2 which are respectively disposed on respective sides of each of the first pattern rows PL1 and have different shapes (e.g., different shapes from the first patterns of the first group P1-1 and/or each other). In an embodiment of the present inventive concept, all of the first patterns P1 may also have the same shape (e.g., the same shape as each other). In other words, in one or more embodiments, the first patterns of the first group P1-1 and the first patterns of the second group P1-2 may have the same shape as each other.

The second patterns P2 are disposed on or at the other side of the center patterns CP in the first direction DR1. The second patterns P2 may define or form a plurality of second pattern rows PL2. The second pattern rows PL2 are arranged in the first direction DR1. In each of the second pattern rows PL2, the second patterns P2 may be arranged in or along the second direction DR2 and may each provide a third opening OP3.

In the illustrated embodiment, two groups of the second patterns P2 are illustrated. Second patterns of a first group P2-1 may have the same shape (e.g., the same shape as each other), and second patterns of a second group P2-2 may have shapes different from the shape of each of the second patterns of the first group P2-1. The second patterns of the first group P2-1 may each have a quadrangular shape. In the illustrated embodiment, the second patterns of the first group P2-1 are illustrated as each having a rectangular shape. The second patterns of the first group P2-1 may each have a shape extending in the first crossing direction CDR1. For example, the long sides of the second patterns of the first group P2-1 may be parallel or substantially parallel to the first crossing direction CDR1.

The second patterns of the second group P2-2 may have shapes each obtained by removing or omitting a portion of any one of the second patterns of the first group P2-1. In the illustrated embodiment, illustrated are two second patterns of the second group P2-2 which are respectively disposed on respective sides of each of the second pattern rows PL2 and have different shapes (e.g., different shapes from the second patterns of the first group P2-1 and/or each other). In an embodiment of the present inventive concept, all of the second patterns P2 may also have the same shape (e.g., the same shape as each other). In other words, in one or more embodiments, the second patterns of the first group P2-1 and the second patterns of the second group P2-2 may have the same shape as each other.

The first patterns P1 and the second patterns P2 may be symmetrical with respect to the center patterns CP. In other words, with respect to an imaginary reference axis which is parallel to the second direction DR2 and overlaps the center patterns CP (e.g., a center point of the center patterns CP), the first patterns of the first group P1-1 and the second patterns of the first group P2-1 may be symmetrical to each other, and the first patterns of the second group P1-2 and the second patterns of the second group P2-2 may be symmetrical to each other. The second opening OP2 and the third opening OP3 may have the same or substantially the same surface area. Each of the second opening OP2 and the third opening OP3 defines a larger surface area than the first opening OP1. The reason for this is to decrease the capacitance of the load capacitor Cb by increasing the percentage of the surface area of the second opening OP2 and the third opening OP3 in the second electrode SE2. A description thereof in more detail will be provided below.

The third patterns P3 connect (e.g., electrically connect) two adjacent patterns from among the plurality of center patterns CP, the plurality of first patterns P1, and the plurality of second patterns P2. The plurality of center patterns CP, the plurality of first patterns P1, the plurality of second patterns P2, and the plurality of third patterns P3 substantially have an integral shape. In other words, the plurality of center patterns CP, the plurality of first patterns P1, the plurality of second patterns P2, and the plurality of third patterns P3 may be integral with each other (i.e., form a monolithic structure). The second electrode SE2 of a mesh shape is formed by etching the conductive layer.

In the illustrated embodiment, three third patterns P3 for connecting (e.g., electrically connecting) each of the center patterns CP to adjacent patterns are illustrated by way of example. Four third patterns P3 for connecting (e.g., electrically connecting) each of the first patterns P1 and the second patterns P2 to adjacent patterns are illustrated. The number of the third patterns P3 connected to each of the center patterns CP is not necessarily limited to the same number. The number of the third patterns P3 connected to each of the first patterns P1 and the second patterns P2 is not necessarily limited to the same number. The third patterns P3 may disconnect the line elements LE1 and LE2 of the first electrode SE1 to be described in more detail below and may divide the first electrode SE1 into a plurality of parts. To adjust the number of the parts constituting the first electrode SE1, some of the third patterns P3 related to the center patterns CP, the first patterns P1, and the second patterns P2 may be removed or disconnected.

The third patterns P3 may include two groups. Third patterns P3-1 of a first group P3-1 each extend in the first crossing direction CDR1, and third patterns of a second group P3-2 each extend in the second crossing direction CDR2.

Some of the first line elements LE1 and some of the second line elements LE2 of the first electrode SE1 have an integral shape. In other words, some of the first line elements LE1 and some of the second line elements LE2 of the first electrode SE1 may be integral with each other (i.e., form a monolithic structure). In one or more embodiments, the integral shape may extend through the crossing area ECA. Some of the first line elements LE1 and some of the second line elements LE2 of the first electrode SE1 may include a plurality of open areas SE1-OP.

In the first area CA1, as illustrated in FIG. 8D, an open area SE1-OP of the open areas SE1-OP may be defined in a first line element LE1 of the first line elements LE1 of the first electrode SE1. A third pattern of the second group P3-2 may pass through the open area SE1-OP.

In the second area CA2, as illustrated in FIG. 8E, an open area SE1-OP of the open areas SE1-OP may be defined in a second line element LE2 of the second line elements LE2 of the first electrode SE1. A third pattern of the first group P3-1 may pass through the open area SE1-OP.

Referring to FIG. 8C again, even when the first electrode SE1 has the plurality of open areas SE1-OP formed therein and includes the plurality of divided parts, the line elements LE1 and LE2 of the first electrode SE1 may form a first current path 1000 that crosses the crossing area ECA in the second direction DR2.

In FIG. 8C, one first current path 1000 is illustrated using a dotted arrow. The third area CA3 enlarged and illustrated in FIG. 8F is disposed in the first current path 1000. The third area CA3 is an area where a bridge pattern BRP is disposed. Although the first current path 1000 formed above the center patterns CP is illustrated as an example in the illustrated embodiment, the first current path 1000 may be formed below the center patterns CP or may also be formed to cross the center patterns CP from thereabove to therebelow.

Referring to FIG. 8F, an open area P3-OP is formed in a third pattern of the second group P3-2. A first line element LE1 of the first line elements LE1 of the first electrode SE1 passes through the open area P3-OP.

Referring to FIG. 8G, an open area P3-OP is formed in a third patterns of the second group P3-2 in the fourth area CA4 also, and a first line element LE1 of the first line elements LE1 of the first electrode SE1 passes through the open area P3-OP. The bridge pattern BRP (referring to FIG. 8F) is not disposed in the fourth area CA4.

According to the embodiment illustrated in FIG. 8C, the second electrode SE2 includes two parts SE2-P1 and SE2-P2 separated with respect to the first current path 1000 and respectively disposed above and below the first current path 1000. Illustrated by way of example is the embodiment in which one bridge pattern BRP is disposed to connect (e.g., electrically connect) a first part SE2-P1 of the second electrode SE2 and a second part SE2-P2 of the second electrode SE2. In one or more embodiments, the first part SE2-P1 and the second part SE2-P2 may be defined by or formed by a plurality of center patterns CP, a plurality of first patterns P1, a plurality of second patterns P2, and a plurality of third patterns P3. In order to reduce defects in a manufacturing process by decreasing the number of bridge patterns BRP, one third area CA3 and seven fourth areas CA4 may be applied in the first current path 1000. In an embodiment of the present inventive concept, some of the fourth areas CA4 may be replaced by third areas CA3.

Referring to FIG. 8C and FIG. 8F, a second current path 2000 crossing the crossing area ECA in the first direction DR1 is formed in the second electrode SE2. The bridge pattern BRP constitutes the second current path 2000. Meanwhile, the second current path 2000 illustrated in FIG. 8C is only an example. After converging on and then passing through the bridge pattern BRP, a plurality of current paths may diverge back.

Referring to FIG. 8H, the bridge pattern BRP may be disposed on the first sensor insulating layer IIL1. The second sensor insulating layer IIL2 covers the bridge pattern BRP. The third pattern of the second group P3-2 is connected to the bridge pattern BRP through contact holes CH. Substantially, the first electrode SE1 and the second electrode SE2 are disposed on the same layer, and the bridge pattern BRP is disposed on a layer different from the layer on which the first electrode SE1 is disposed. In one or more embodiments, the bridge pattern BRP may be at a different layer from the first electrode SE1. The bridge pattern BRP may be disposed on the second sensor insulating layer IIL2, and the first electrode SE1 and the second electrode SE2 may be disposed on the first sensor insulating layer IIL1 in an embodiment of the present inventive concept.

FIG. 8I illustrates a third area CA3 according to an embodiment of the present inventive concept. A third pattern of a second group P3-2 is not disposed in the third area CA3. It may be seen that objects a bridge pattern BRP connects is different from the object the bridge pattern BRP illustrated in FIG. 8F connects. The bridge pattern BRP may connect (e.g., electrically connect) adjacent first patterns P1.

FIG. 8J illustrates a third area CA3 according to an embodiment of the present inventive concept. It may be seen that an object a bridge pattern BRP connects is different from the object the bridge pattern BRP illustrated in FIG. 8F connects. An open area SE1-OP may be formed in a first line element LE1 of a first electrode SE1, and a third pattern of a second group P3-2 may pass through the open area SE1-OP. The bridge pattern BRP is disposed on a layer different from the layer on which the first line element LE1 is disposed, and may connect (e.g., electrically connect) the first line element LE1 in the open area SE1-OP. The bridge pattern BRP constitutes the first current path 1000 of FIG. 8C.

Referring back to FIG. 8B, the second electrode SE2 may further include a fourth pattern P4. The fourth pattern P4 is disposed at a boundary between two adjacent unit sensing areas UA in the first direction DR1 from among the plurality of unit sensing areas UA. The fourth pattern P4 provides a fourth opening OP4.

In one or more embodiments, a plurality of fourth patterns P4 is provided, and the fourth patterns P4 are arranged in or along the second direction DR2. Each of the fourth patterns P4 may have a shape symmetrical with respect to the second direction DR2 (e.g., an imaginary reference axis extending in the second direction DR2). The fourth pattern P4 may have a shape symmetrical with respect to a boundary line, which extends in the second direction DR2, between two adjacent unit sensing areas UA in the first direction DR1.

The fourth pattern P4 is connected (e.g., electrically connected) to an adjacent first pattern P1 and an adjacent second pattern P2 through the third patterns P3.

Figure 9A:
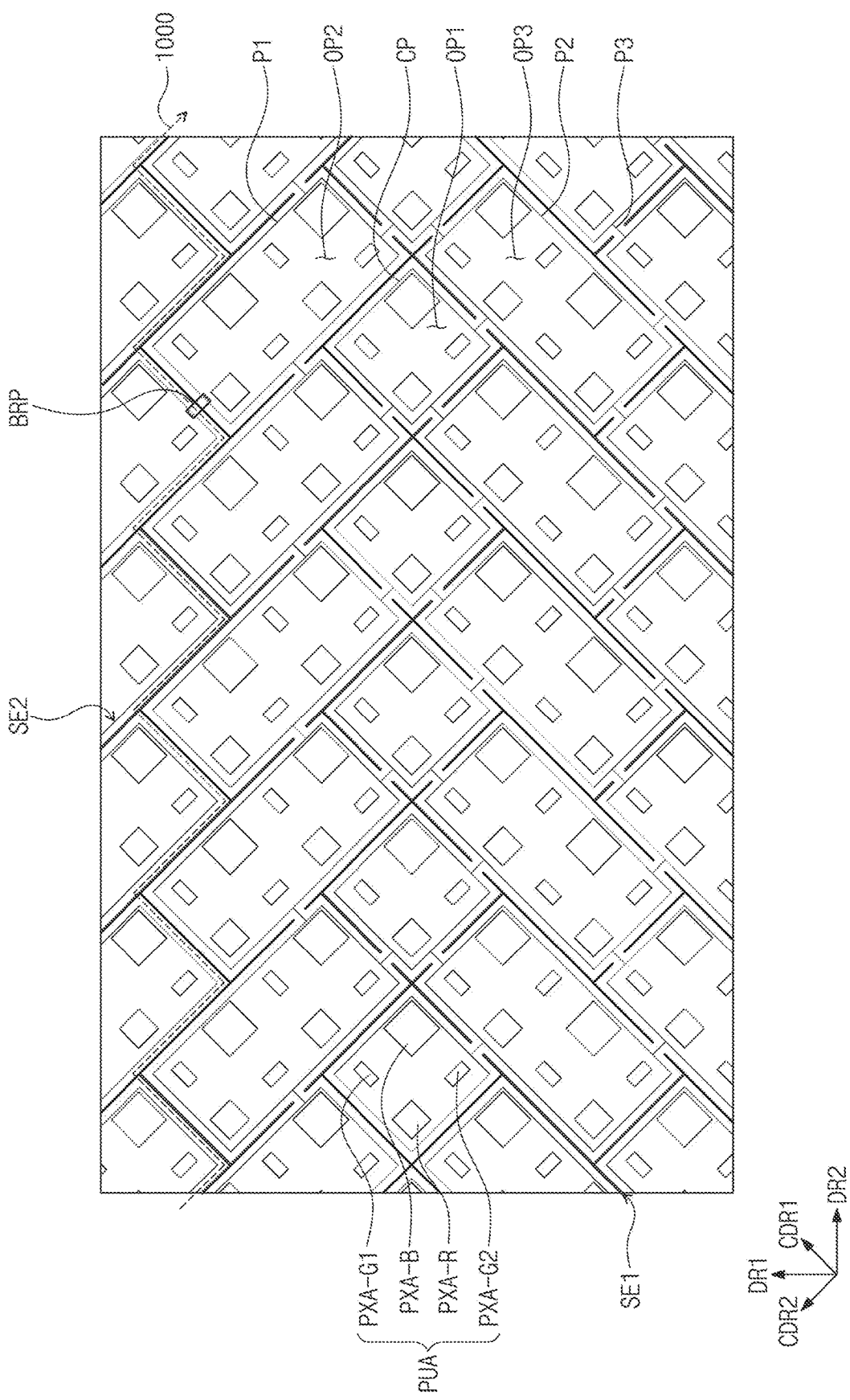
FIGS. 9A-9C are each an enlarged plan view of a portion of a unit sensing area according to embodiments of the present inventive concept.
Figure 9B:
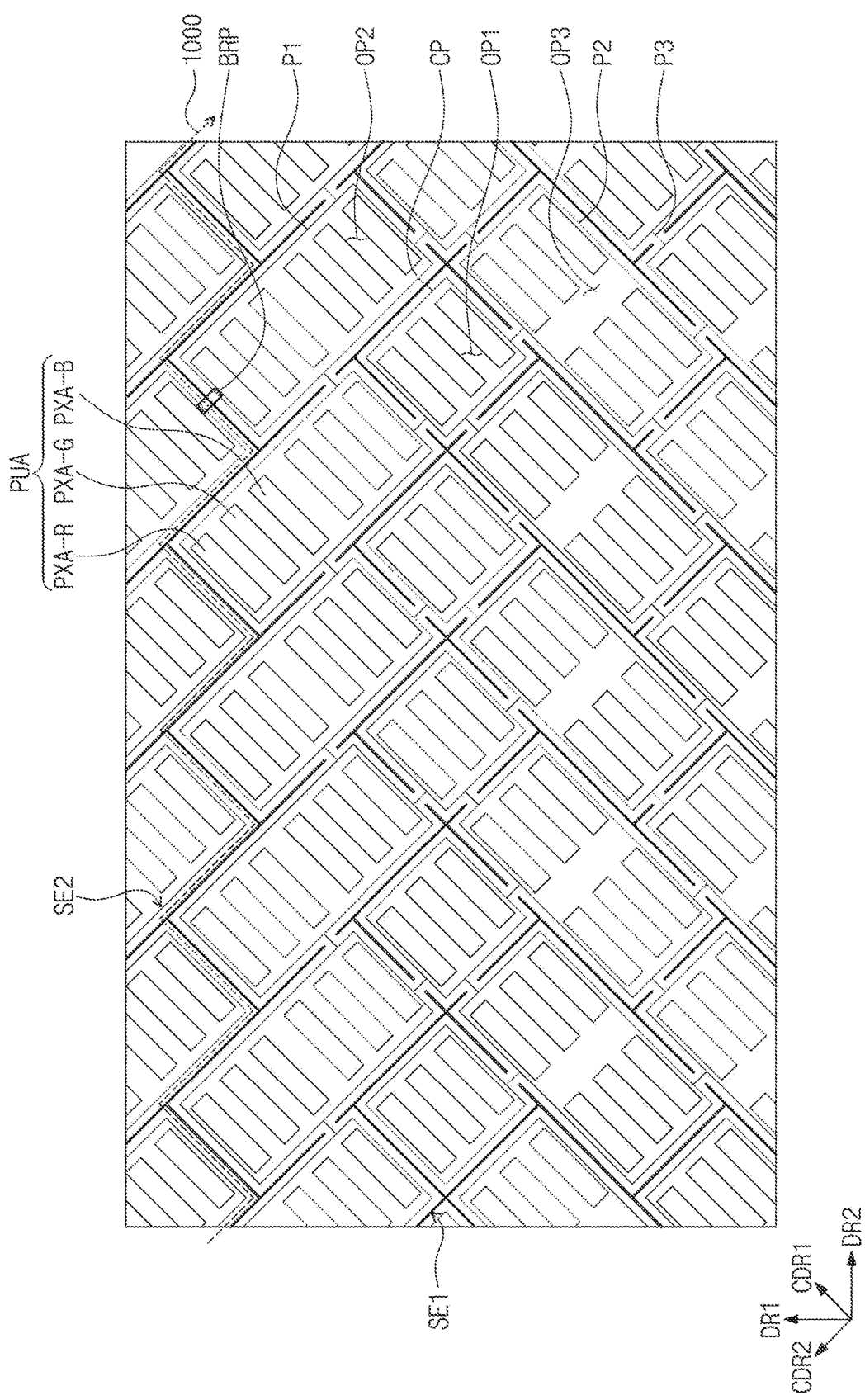
Figure 9C:
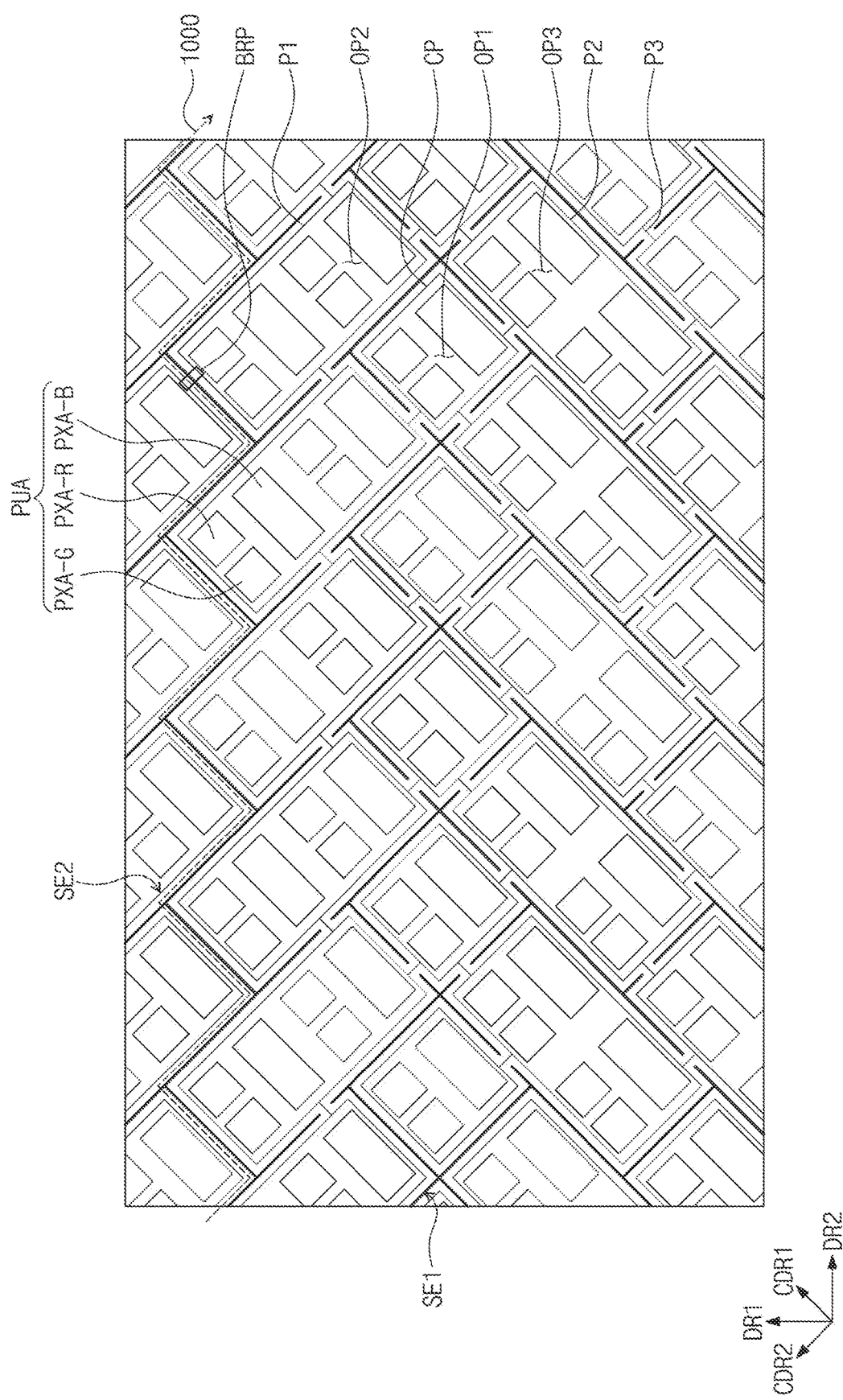

FIGS. 9A-9C are each an enlarged plan view of a portion of a unit sensing area UA according to embodiments of the present inventive concept.

FIG. 9A illustrates light emitting areas PXA-R, PXA-B, PXA-G1, and PXA-G2 corresponding to the light emitting area PXA illustrated in FIG. 4. Four types of light emitting areas PXA-R, PXA-B, PXA-G1, and PXA-G2 having different shapes are illustrated by way of example, but the present inventive concept is not limited thereto. Although, in the illustrated embodiment, two types of light emitting areas from among the four types of light emitting areas PXA-R, PXA-B, PXA-G1, and PXA-G2 are illustrated to generate light of the same color, the present inventive concept is not limited thereto.

A first light emitting area PXA-R is a light emitting area of a pixel of a first color, a second light emitting area PXA-B is a light emitting area of a pixel of a second color, and third and fourth light emitting areas PXA-G1 and PXA-G2 are light emitting areas of a pixel of a third color. In one or more embodiments, a light (e.g., light beam) of the first color may be a red light (e.g., a red light beam), a light (e.g., a light beam) of the second color may be a blue light (e.g., a blue light beam), and a light (e.g., a light beam) of the third color may be a green light (e.g., a green light beam). However, the present disclosure is not limited thereto. For example, the light (e.g., light beams) of the first to third colors (i.e., the first color, the second color, and the third color) may be any suitable color such as, for example, light (e.g., light beams) of another three main colors (e.g., three primary colors). In an embodiment of the present inventive concept, the third and fourth light emitting areas PXA-G1 and PXA-G2 may have the same shape (e.g., the same shape as each other).

The light emitting areas PXA-R, PXA-B, PXA-G1, and PXA-G2 may define or form a plurality of unit light emitting areas PUA. The unit light emitting areas PUA may each include a plurality of light emitting areas and may include the same number of the light emitting areas. The unit light emitting areas PUA may have the same arrangement of the light emitting areas. The plurality of unit light emitting areas PUA may have the same or substantially the same surface area when viewed in a plane.

Each of the unit light emitting areas PUA includes the first light emitting area PXA-R, the second light emitting area PXA-B, the third light emitting area PXA-G1, and the fourth light emitting area PXA-G2. The first light emitting area PXA-R and the second light emitting area PXA-B may be disposed to face each other in the second direction DR2, and the third light emitting area PXA-G1 and the fourth light emitting area PXA-G2 may be disposed to face each other in the first direction DR1.

The first line elements LE1 and the second line elements LE2 constituting the first electrode SE1 and the second electrode SE2 are disposed in the non-light emitting area NPXA. In other words, the plurality of center patterns CP, the plurality of first patterns P1, the plurality of second patterns P2, and the plurality of third patterns P3 overlap the non-light emitting area NPXA. One unit light emitting area PUA may be disposed inside the first opening OP1. Two unit light emitting areas PUA may be disposed inside each of the second opening OP2 and the third opening OP3 having larger surface areas than the first opening OP1. As the surface areas of the first opening OP1, the second opening OP2, and the third opening OP3 increase, load capacitance due to the second electrode SE2 may decrease because the surface area of an area, where the first line elements LE1 and the second line elements LE2 of the second electrode SE2 overlap the display panel DP, is reduced. As the surface area of the first electrode SE1 is proportional to the surface area of the second electrode SE2 in the crossing area ECA (e.g., see FIG. 8B), the surface area of the first electrode SE1 is reduced due to the decrease of the surface area of the second electrode SE2, and as a result, load capacitance between the display panel DP and the first electrode SE1 may be reduced. As the load capacitance of the first and second electrodes SE1 and SE2 with respect to the display panel is reduced, sensing sensitivity of the input device of the active type may be improved.

Referring to FIG. 9B, each of unit light emitting areas PUA includes a first light emitting area PXA-R, a second light emitting area PXA-B, and a third light emitting area PXA-G. Although the unit light emitting areas PUA in which the third light emitting area PXA-G is disposed between the first light emitting area PXA-R and the second light emitting area PXA-B are illustrated, the arrangement of the light emitting areas may be changed. Each of the first light emitting area PXA-R, the second light emitting area PXA-B, and the third light emitting area PXA-G may have a shape extending in a first crossing direction CDR1. The first light emitting area PXA-R, the second light emitting area PXA-B, and the third light emitting area PXA-G may have the same or substantially the same surface area. However, the present disclosure is not limited thereto.

Referring to FIG. 9C, each of unit light emitting areas PUA includes a first light emitting area PXA-R, a second light emitting area PXA-B, and a third light emitting area PXA-G. The second light emitting area PXA-B has a largest surface area. The first light emitting area PXA-R and the third light emitting area PXA-G may be disposed on or at one side of the second light emitting area PXA-B. The first light emitting area PXA-R and the third light emitting area PXA-G may have the same or substantially the same surface area.

Figure 10:
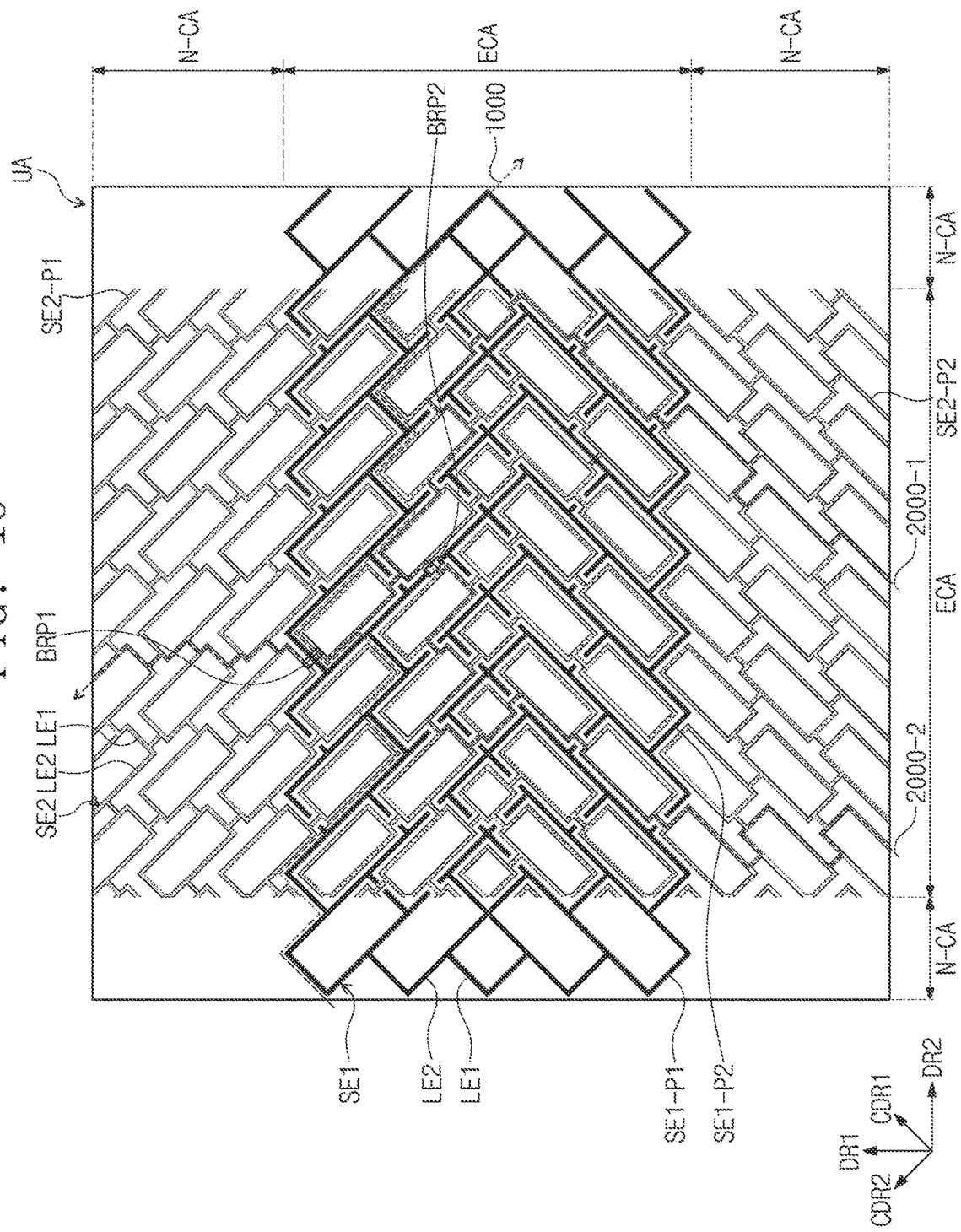
FIG. 10 and FIG. 11 are each an enlarged plan view of a unit sensing area according to embodiments of the present inventive concept.
Figure 11:
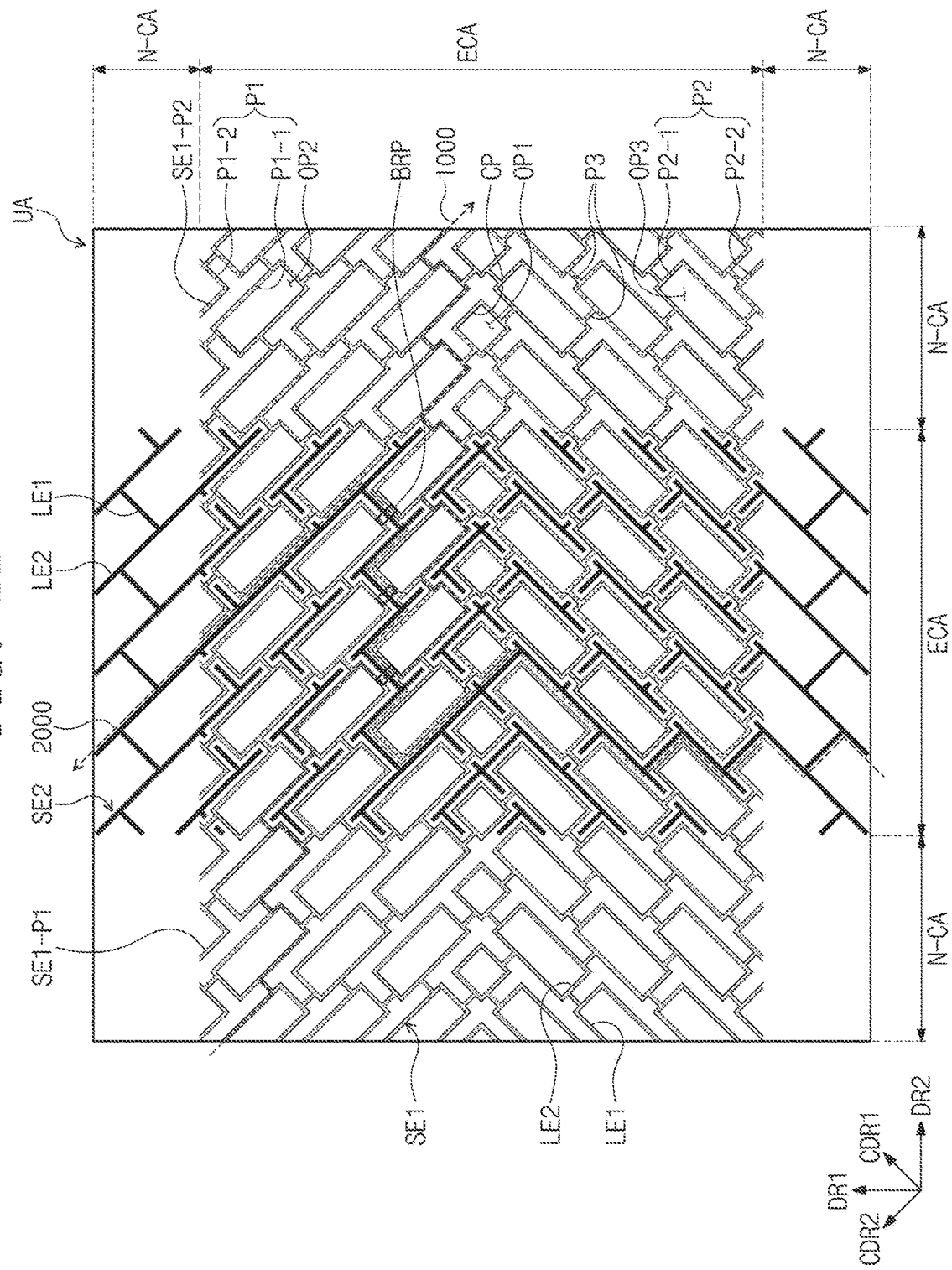

FIG. 10 and FIG. 11 are each an enlarged plan view of a unit sensing area UA according to embodiments of the present inventive concept. Hereinafter, a description may not be repeated for a component that is the same as a component described with reference to FIGS. 1-9C.

Referring to FIG. 10, a second electrode SE2 includes two parts SE2-P1 and SE2-P2 separated with respect to a first current path 1000 and respectively disposed above and below the first current path 1000. Illustrated by way of example is an embodiment in which one first bridge pattern BRP1 is disposed to connect (e.g., electrically connect) a first part SE2-P1 of the second electrode SE2 and a second part SE2-P2 of the second electrode SE2. It may be seen that the first current path 1000 has a path different from the path of the first current path 1000 illustrated in FIG. 8C. This is because the position of the first bridge pattern BRP1 is different from the position of the bridge pattern BRP of FIG. 8C.

A first electrode SE1 may also include a plurality of parts. The first electrode SE1 including two parts SE1-P1 and SE1-P2 is illustrated. Illustrated by way of example is an embodiment in which one second bridge pattern BRP2 is disposed to connect (e.g., electrically connect) a first part SE1-P1 of the first electrode SE1 and a second part SE1-P2 of the first electrode SE1. FIG. 10 illustrates two second current paths 2000-1 and 2000-2. Both of the two second current paths 2000-1 and 2000-2 pass through the first bridge pattern BRP1. The second part SE1-P2 of the first electrode SE1 is disposed inside between the two second current paths 2000-1 and 2000-2.

In the unit sensing area UA, referring to FIG. 11, a first electrode SE1 includes a plurality of center patterns CP, a plurality of first patterns P1, a plurality of second patterns P2, and a plurality of third patterns P3. In a crossing area ECA, line elements LE1 and LE2 of a second electrode SE2 are disposed in at least some of areas between two adjacent patterns from among the plurality of center patterns CP, the plurality of first patterns P1, the plurality of second patterns P2, and the plurality of third patterns P3.

Illustrated by way of example is the unit sensing area UA in which one first current path 1000 and one second current path 2000 intersecting each other are formed. The first electrode SE1 may include two parts SE1-P1 and SE1-P2 separated with respect to the second current path 2000. Illustrated as an example in the illustrated embodiment are three bridge patterns BRP connecting a first part SE1-P1 of the first electrode SE1 and a second part SE1-P2 of the first electrode SE1. However, the present disclosure is not limited thereto, and the unit sensing area UA in which the first current path 1000 passes through one leftmost bridge pattern BRP of the three bridge patterns BRP is illustrated by way of example.

As described above, the gap between the first electrode and the second electrode is narrowed, and the length of a portion where the first electrode faces the second electrode increases, thereby increasing capacitance between the first and second electrodes. In addition, the amount of change in capacitance also increases between before and after an input by an input device of a passive type. Sensing sensitivity may be improved for the input device of the passive type.

Load capacitance (or base capacitance) between the display panel and the first and second electrodes may be reduced by increasing the surface areas of the openings of the first electrode and the second electrode. As the load capacitance between the display panel and the first and second electrodes is reduced, sensing sensitivity may be improved for an input device of an active type.

Defects in manufacturing may be reduced by decreasing the number of bridge patterns in the crossing area of the first electrode and the second electrode.

Although the embodiments of the present inventive concept have been described herein, it is understood that various changes and modifications can be made by those skilled in the art within the spirit and scope of the present inventive concept defined by the following claims or the equivalents. Therefore, the embodiments described herein are not intended to limit the technical spirit and scope of the present disclosure, and all technical spirit within the scope of the following claims or the equivalents will be construed as being included in the scope of the present disclosure, and equivalents thereof.

What is claimed is:

1. A display device comprising:
   a display panel comprising a plurality of light emitting areas and a non-light emitting area adjacent to the plurality of light emitting areas; and
   an input sensor on the display panel, the input sensor comprising a first electrode, a second electrode crossing the first electrode, and a bridge pattern at a crossing area of the first electrode and the second electrode,
   wherein one of the first electrode and the second electrode comprises:
   a plurality of enclosed line patterns, each of the plurality of enclosed line patterns having an opening; and
   a plurality of line patterns connecting two adjacent enclosed line patterns from among the plurality of enclosed line patterns, and
   wherein the other one of the first electrode and the second electrode comprises a plurality of line elements between two adjacent enclosed line patterns from among the plurality of enclosed line patterns, and
   corresponding light emitting areas of the plurality of light emitting areas are overlapped with the opening.

2. The display device of claim 1, wherein a width of the first electrode is substantially uniform, and a width of the second electrode is substantially uniform.

3. The display device of claim 1, wherein the plurality of enclosed line patterns comprises center enclosed line patterns having the same shape, and the center enclosed line patterns are arranged along a first direction.

4. The display device of claim 3, wherein the one of the first electrode and the second electrode further comprises a dummy pattern located outside the center enclosed line patterns in the first direction.

5. The display device of claim 3, wherein the plurality of enclosed line patterns further comprises first enclosed line patterns located at one side of the center enclosed line patterns in a second direction crossing the first direction and second enclosed line patterns located at another side of the center enclosed line patterns in the second direction.

6. The display device of claim 5, wherein the center enclosed line patterns have the same shape as each other, and
   the first enclosed line patterns have a shape different from the shape of the center enclosed line patterns.

7. The display device of claim 6, wherein the first enclosed line patterns and the second enclosed line patterns are symmetrical with respect to the center enclosed line patterns.

8. The display device of claim 1, wherein the plurality of enclosed line patterns forms a plurality of rows arranged along a first direction.

9. The display device of claim 1, wherein the bridge pattern comprises a first bridge pattern,
   wherein the second electrode comprises a first part and a second part spaced from each other,
   wherein the first bridge pattern electrically connects the first part and the second part, and
   wherein the plurality of enclosed line patterns and the plurality of line patterns form the first part and the second part.

10. The display device of claim 9, wherein the first bridge pattern is in a current path of the second electrode.

11. The display device of claim 1, wherein the bridge pattern comprises a second bridge pattern,
   wherein the first electrode comprises a first part and a second part spaced from each other, and
   wherein the second bridge pattern electrically connects the first part and the second part.

12. The display device of claim 1, wherein the input sensor further comprises an insulating layer,
wherein the bridge pattern is below the insulating layer, and
wherein the first electrode and the second electrode are above the insulating layer.

13. The display device of claim 1, wherein the plurality of line elements comprises first line elements extending in a first crossing direction and second line elements extending in a second crossing direction,
wherein a first open area through which a corresponding line pattern of the plurality of line patterns passes is defined in a first line element of the first line elements, and
wherein a second open area through which a corresponding line pattern of the plurality of line patterns passes is defined in a second line element of the second line elements.

14. The display device of claim 1, wherein the plurality of line elements comprises first line elements extending in a first crossing direction and second line elements extending in a second crossing direction, and
wherein a part of the first line elements and a part of the second line elements have an integral shape in the crossing area of the first electrode and the second electrode.

15. The display device of claim 1,
wherein the plurality of enclosed line patterns, the plurality of line patterns, and the plurality of line elements overlap the non-light emitting area.

16. The display device of claim 1, wherein the corresponding light emitting areas comprise a first light emitting area to generate light of a first color, a second light emitting area to generate light of a second color, a third light emitting area to generate light of a third color, and a fourth light emitting area to generate light of the third color.

17. The display device of claim 1, further comprising an input device configured to provide a driving signal to the input sensor,
wherein the input sensor is configured to sense a user input through a change in capacitance between the first electrode and the second electrode in a first mode and to sense an input of the input device on a basis of the driving signal in a second mode.

18. A display device comprising:
a display panel; and
an input sensor on the display panel and comprising a sensing area having a plurality of unit sensing areas arranged along a first direction and a second direction crossing each other in a matrix form,
wherein, in each of the plurality of unit sensing areas, the input sensor comprises:
a plurality of enclosed line patterns, each of the plurality of enclosed line patterns having an opening;
line patterns electrically connecting two adjacent enclosed line patterns from among the plurality of enclosed line patterns;
a plurality of line elements between two adjacent enclosed line patterns of the plurality of enclosed line patterns; and
a bridge pattern connecting at least one of a first open area defined in a line element from among the plurality of line elements or a second open area defined in a line pattern from among the line patterns.

19. The display device of claim 18, further comprising a plurality of dummy patterns at a boundary of two adjacent unit sensing areas in the first direction from among the plurality of unit sensing areas, each of the plurality of dummy patterns having a dummy opening.

20. The display device of claim 19, wherein each of the plurality of dummy patterns is symmetrical with respect to the second direction.

21. The display device of claim 20, wherein the plurality of enclosed line patterns and the line patterns are electrically connected to form a current path in one of the first direction and the second direction,
wherein the plurality of line elements are electrically connected to form a current path in the other one of the first direction and the second direction, and
wherein the plurality of line elements is electrically insulated from the plurality of enclosed line patterns.

22. A display device comprising:
a display panel; and
an input sensor on the display panel, the input sensor comprising a sensing area having a plurality of unit sensing areas arranged along a first direction and a second direction crossing each other in a matrix form,
wherein, in each of the plurality of unit sensing areas, the input sensor comprises:
a plurality of enclosed line patterns, each of the plurality of enclosed line patterns having an opening;
a plurality of line patterns electrically connecting two adjacent patterns from among the plurality of enclosed line patterns;
a plurality of line elements between two adjacent patterns from among the plurality of enclosed line patterns; and
a bridge pattern connecting two adjacent enclosed line patterns from among the plurality of enclosed line patterns.

* * * * *